United States Patent
Lin et al.

(10) Patent No.: US 7,592,216 B2
(45) Date of Patent: Sep. 22, 2009

(54) FABRICATION PROCESS OF A SEMICONDUCTOR DEVICE HAVING A CAPACITOR

(75) Inventors: Jun Lin, Kawasaki (JP); Hiroyuki Ogawa, Kawasaki (JP); Hideyuki Kojima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/127,067

(22) Filed: May 27, 2008

(65) Prior Publication Data

US 2009/0098696 A1    Apr. 16, 2009

(30) Foreign Application Priority Data

Oct. 11, 2007    (JP) ............................. 2007-265838

(51) Int. Cl.
*H01L 21/8234* (2006.01)

(52) U.S. Cl. .................. 438/238; 438/243; 438/296; 438/385; 438/386

(58) Field of Classification Search .............. 438/210, 438/238–239, 243–244, 253, 296, 381–382, 438/385–387, 396; 216/6
See application file for complete search history.

(56) References Cited

U.S. PATENT DOCUMENTS

| | | | | |
|---|---|---|---|---|
| 4,419,812 A * | 12/1983 | Topich | ....................... | 438/238 |
| 5,013,677 A * | 5/1991 | Hozumi | ..................... | 438/330 |
| 5,356,826 A * | 10/1994 | Natsume | ...................... | 438/238 |
| 5,470,775 A * | 11/1995 | Nariani | ....................... | 438/384 |
| 5,489,547 A * | 2/1996 | Erdeljac et al. | ............. | 438/238 |
| 5,597,759 A * | 1/1997 | Yoshimori | ................... | 438/384 |
| 5,759,887 A * | 6/1998 | Ito et al. | ..................... | 438/238 |
| 6,025,219 A | 2/2000 | Kinoshita | | |
| 6,090,656 A * | 7/2000 | Randazzo | ................... | 438/239 |
| 6,110,772 A * | 8/2000 | Takada et al. | ............... | 438/238 |
| 6,130,138 A * | 10/2000 | Oh | ............................ | 438/393 |
| 6,204,105 B1 * | 3/2001 | Jung | ........................... | 438/238 |
| 6,246,084 B1 * | 6/2001 | Kim | ........................... | 257/296 |
| 6,432,791 B1 * | 8/2002 | Hutter et al. | ................ | 438/381 |
| 6,436,750 B1 * | 8/2002 | Dahl | .......................... | 438/210 |
| 2007/0281418 A1 * | 12/2007 | Hu et al. | ..................... | 438/238 |

FOREIGN PATENT DOCUMENTS

| | | |
|---|---|---|
| JP | 10-275871 | 10/1998 |
| JP | 2000-183177 | 6/2000 |

\* cited by examiner

*Primary Examiner*—M. Wilczewski
*Assistant Examiner*—Toniae M Thomas
(74) *Attorney, Agent, or Firm*—IPUSA, PLLC

(57) ABSTRACT

A method of manufacturing a semiconductor device includes forming a first trench in a capacitor device region of a semiconductor substrate, forming a capacitor insulation film over a sidewall surface of the first trench, forming a semiconductor film to cover the first trench, a resistor device region of the semiconductor substrate and a logic device region of the semiconductor substrate, introducing a first impurity element into the semiconductor film formed over the first trench, patterning the semiconductor film to form a top electrode in the capacitor device region, a resistor in the resistor device region and a gate electrode in the logic device region, annealing the semiconductor substrate, and introducing a second impurity element in the resistor.

15 Claims, 35 Drawing Sheets

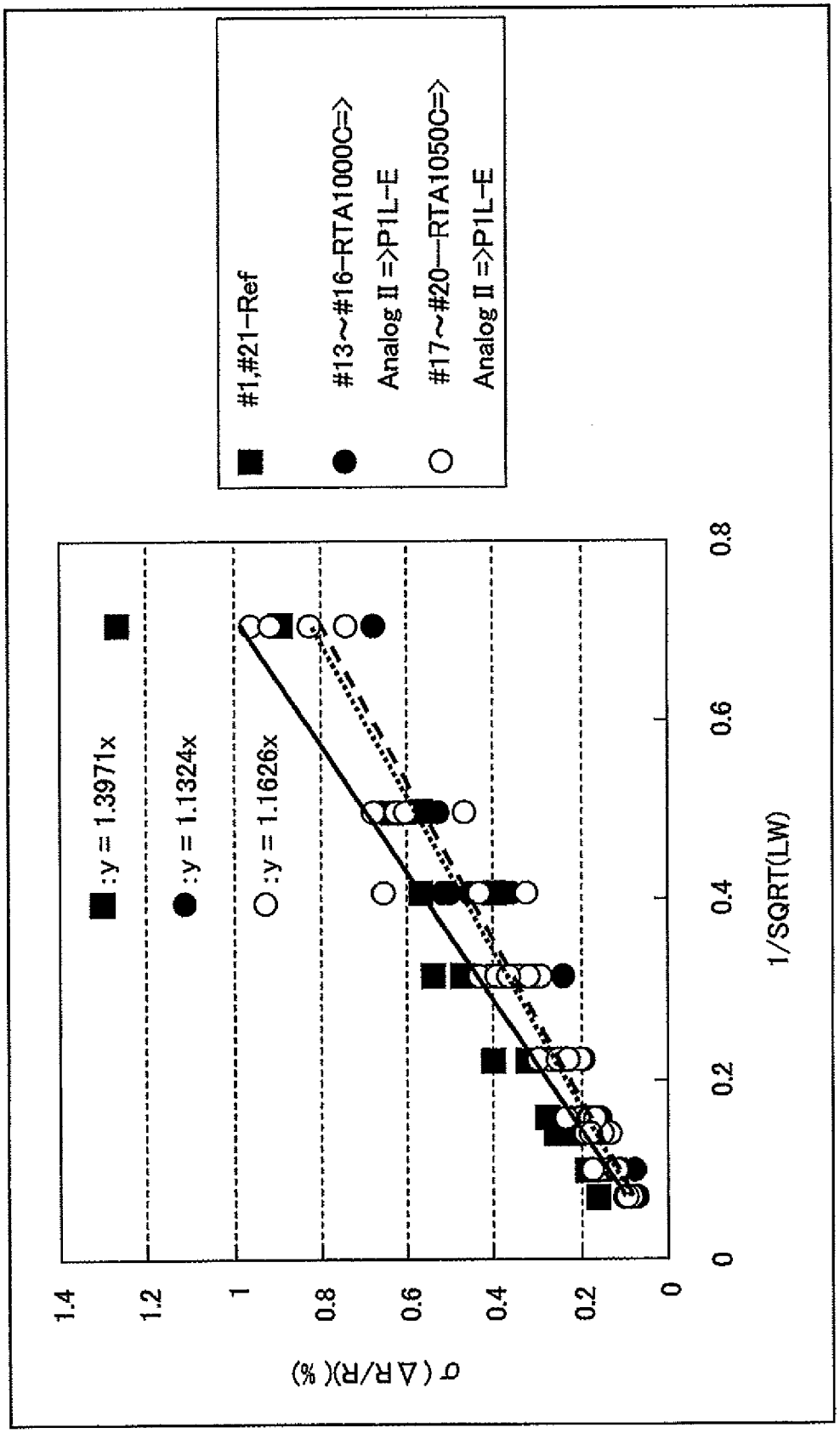

$$\Delta R/R = (R_1 - R_2) \Big/ \frac{1}{2}(R_1 + R_2)$$

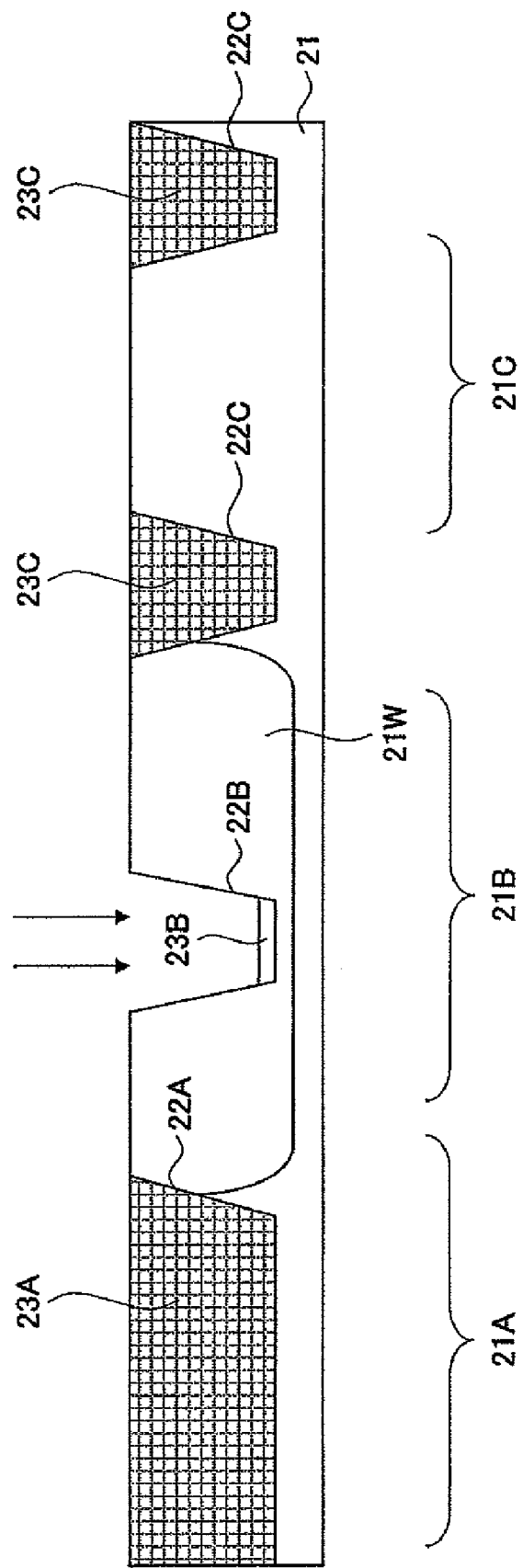

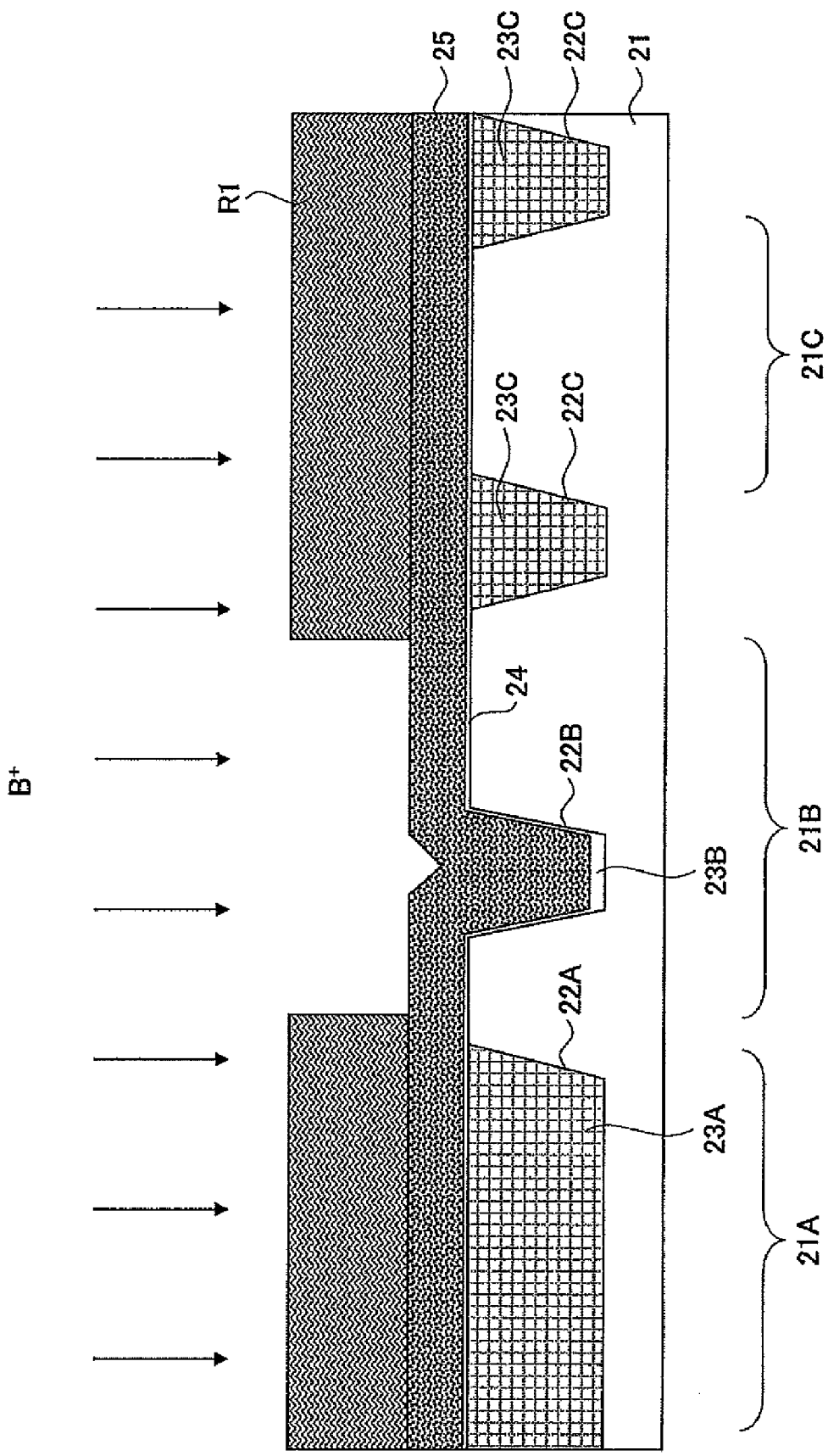

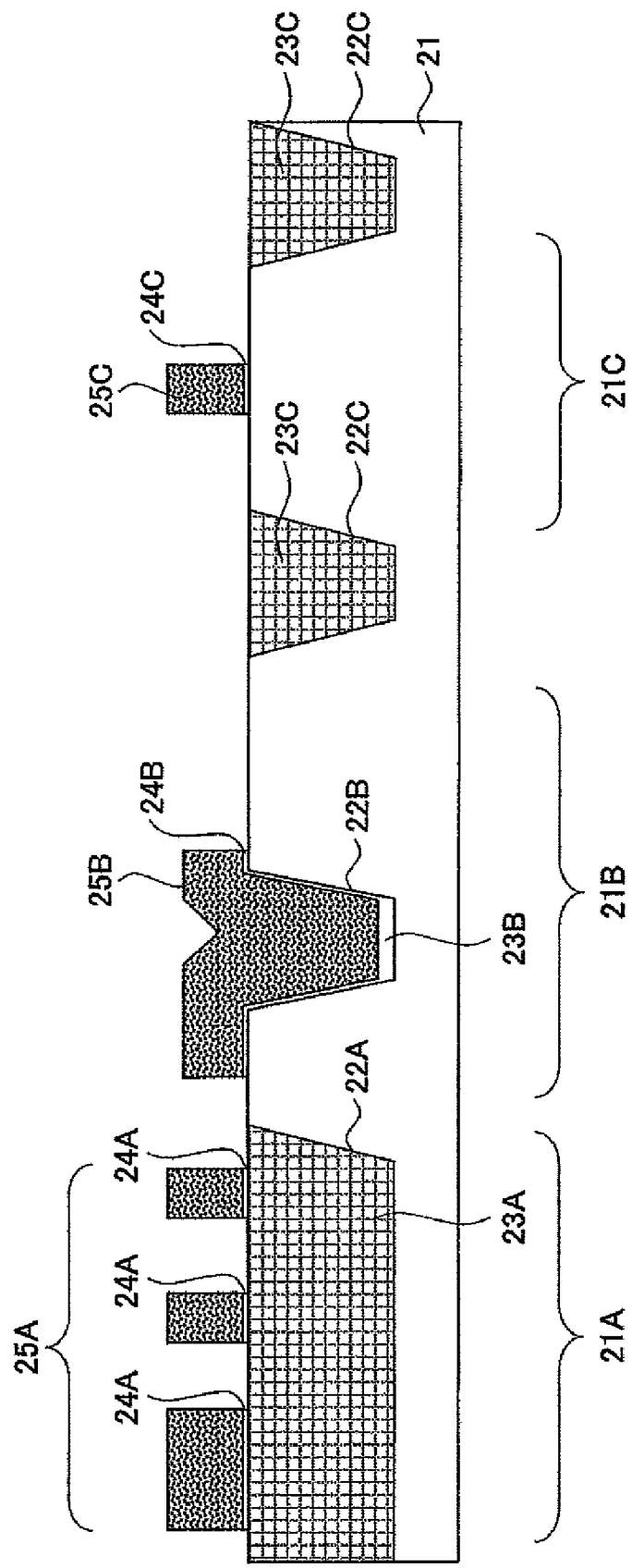

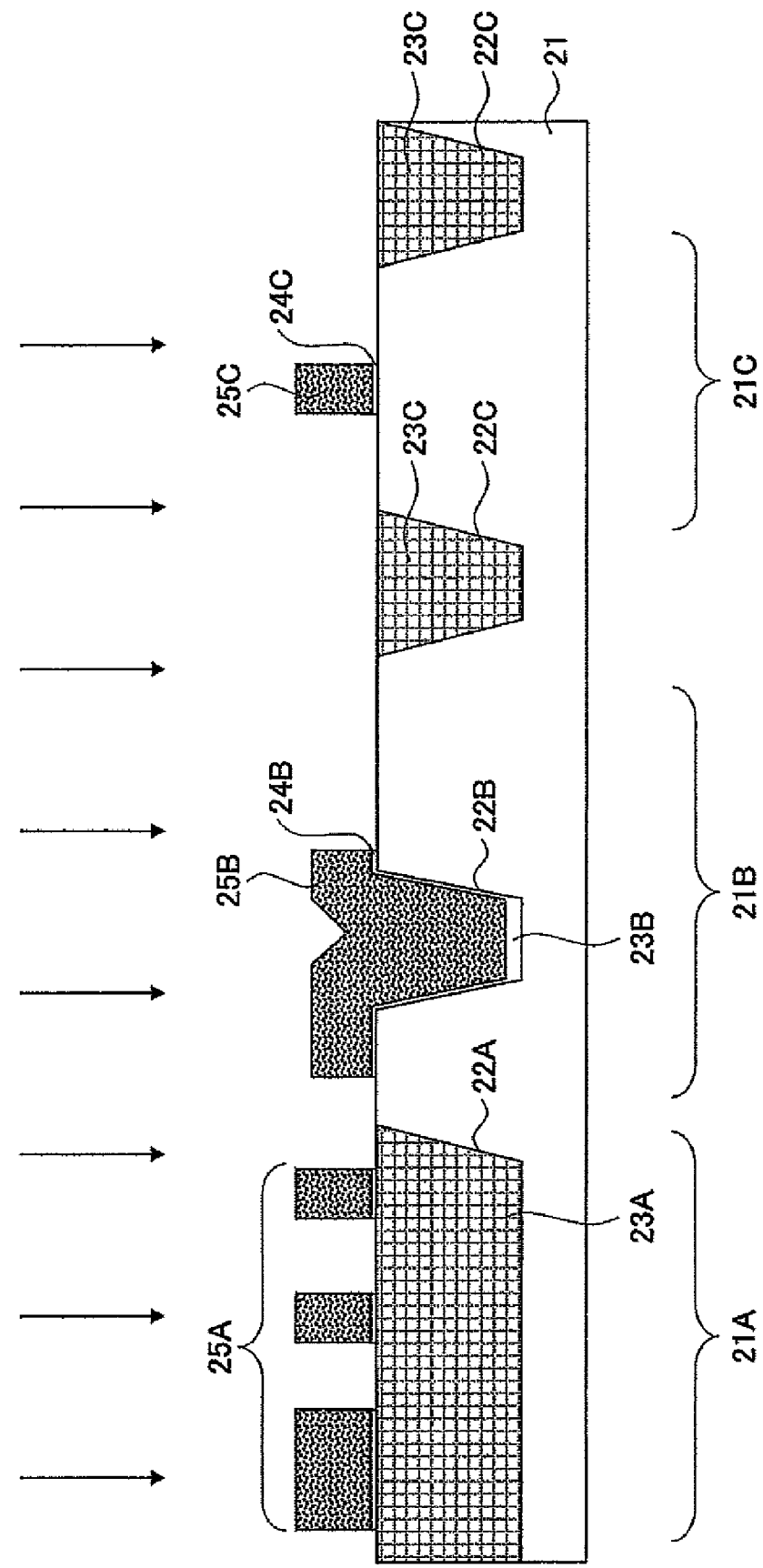

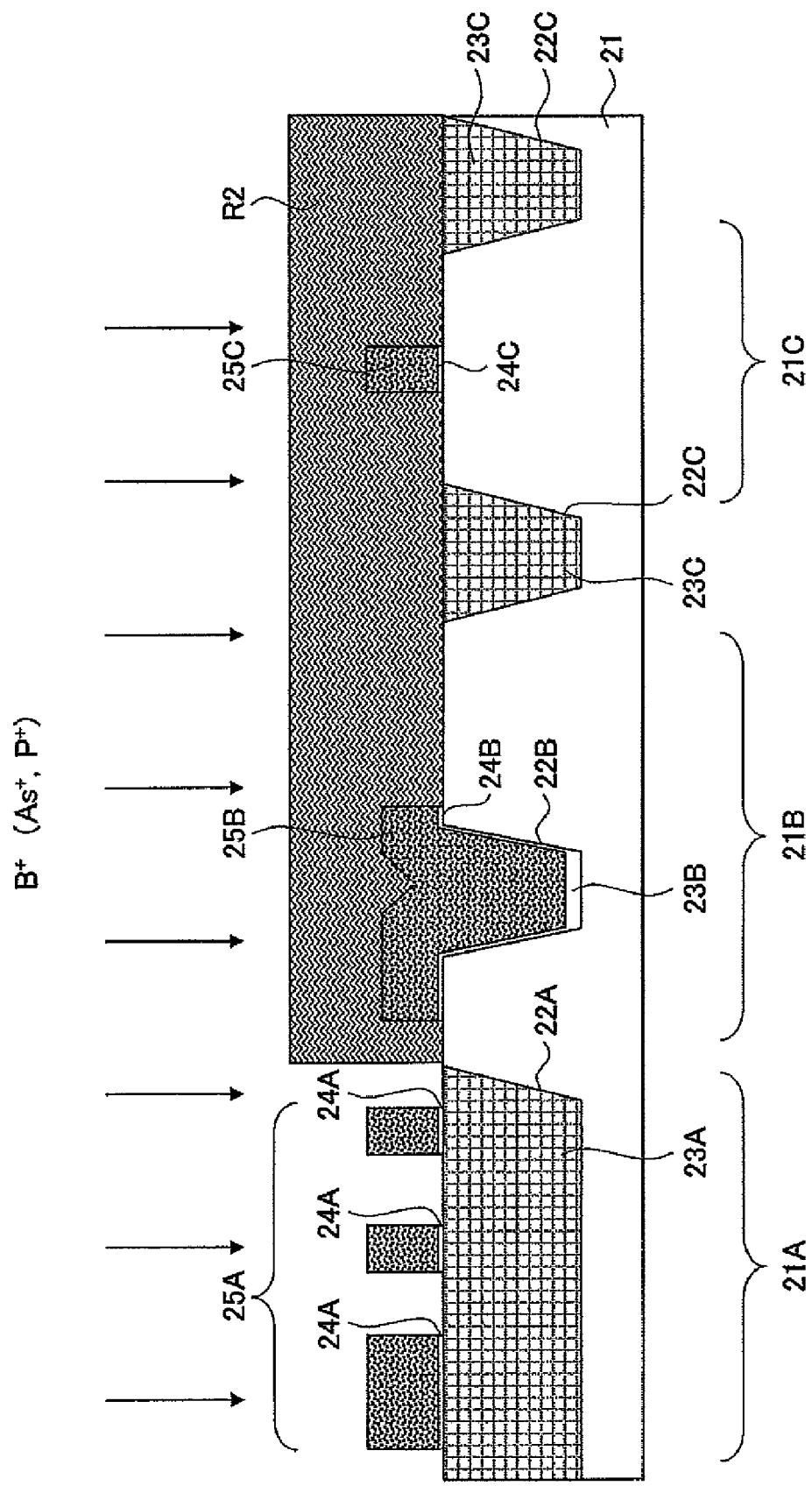

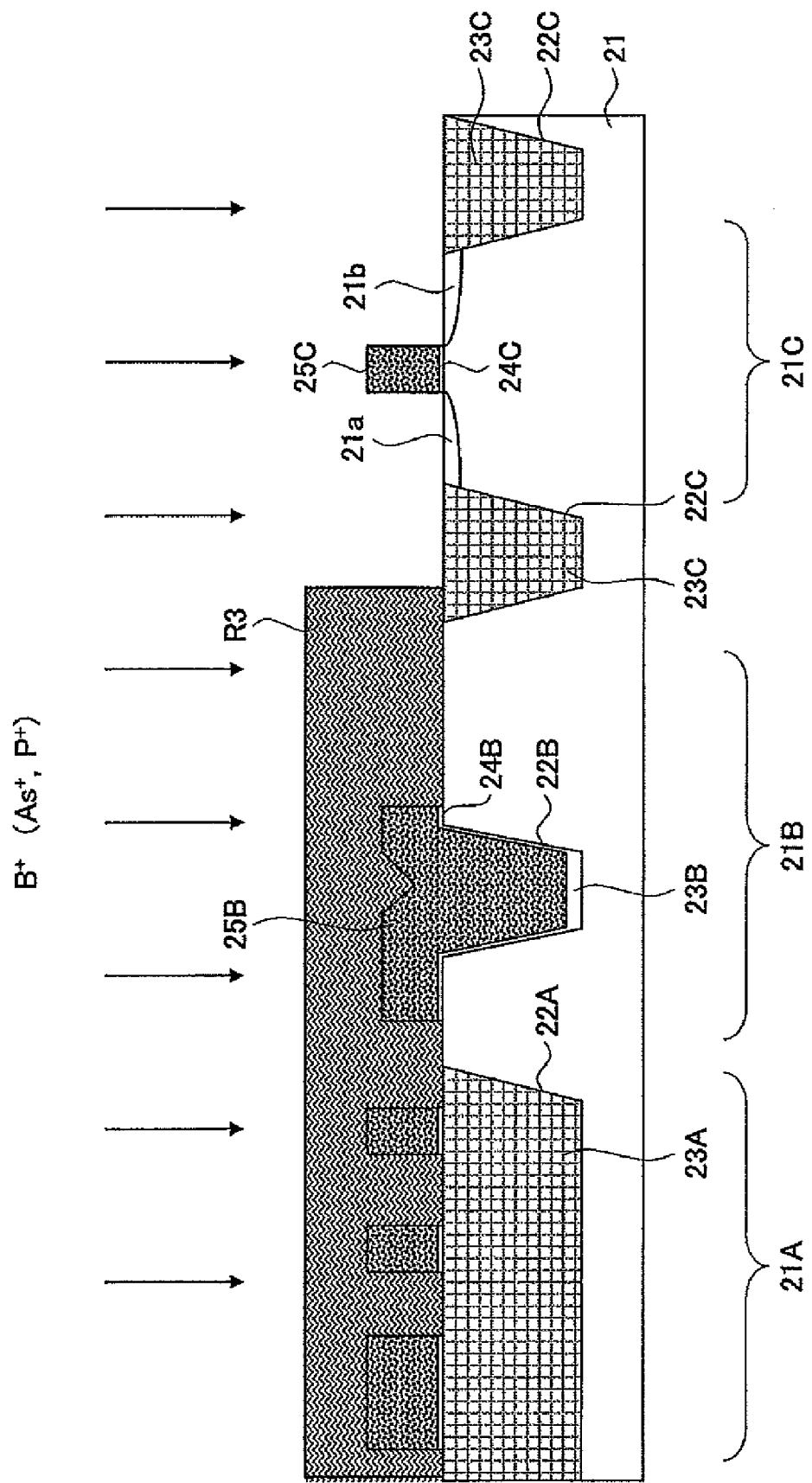

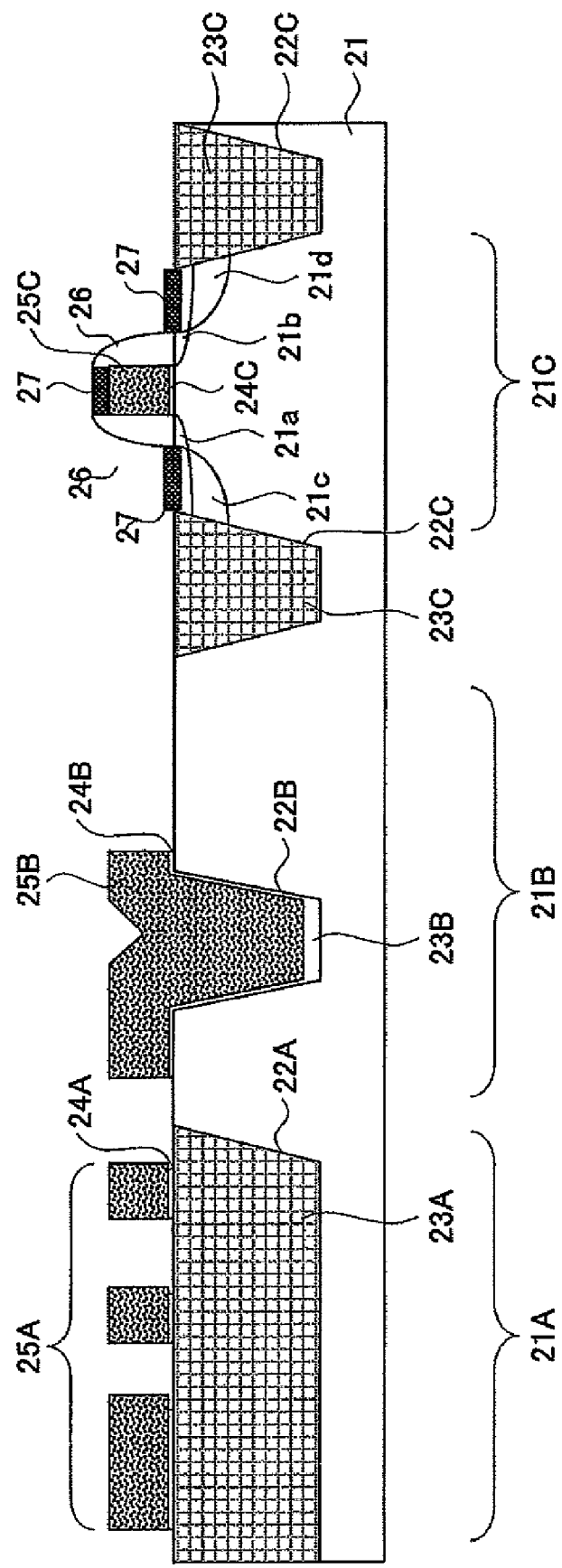

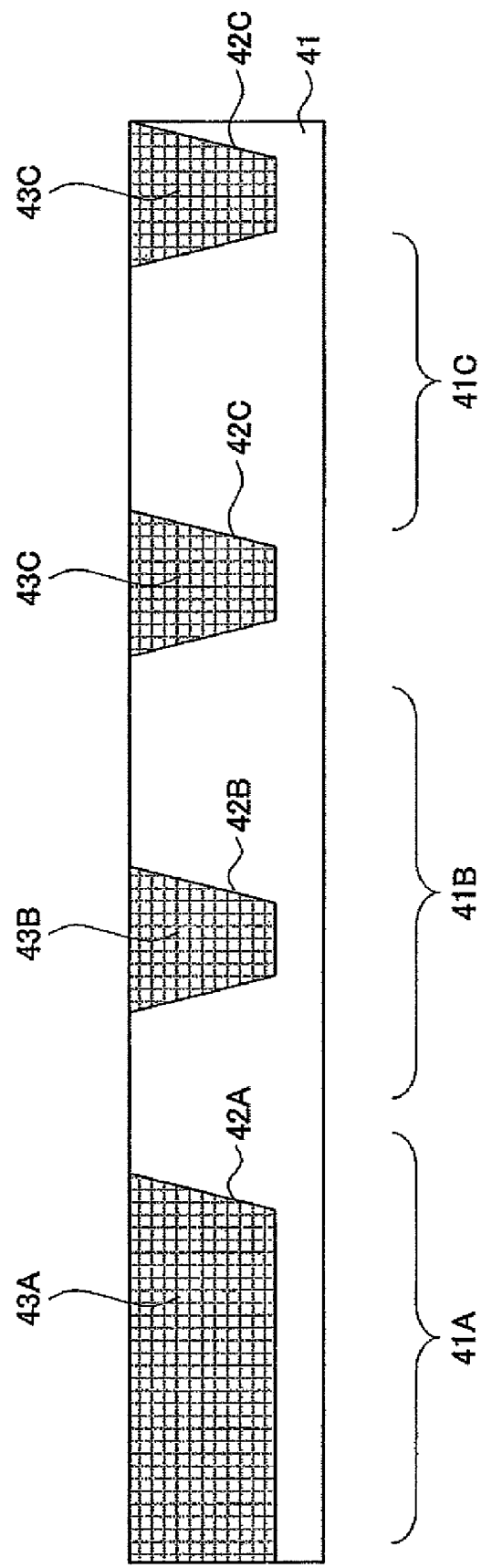

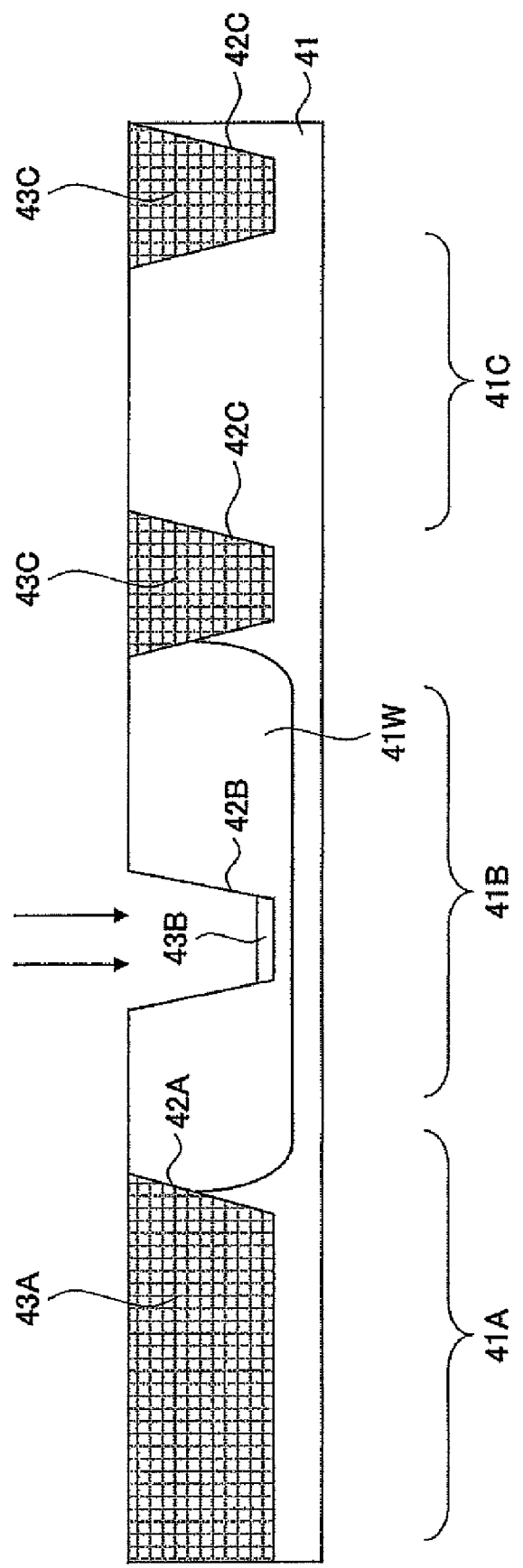

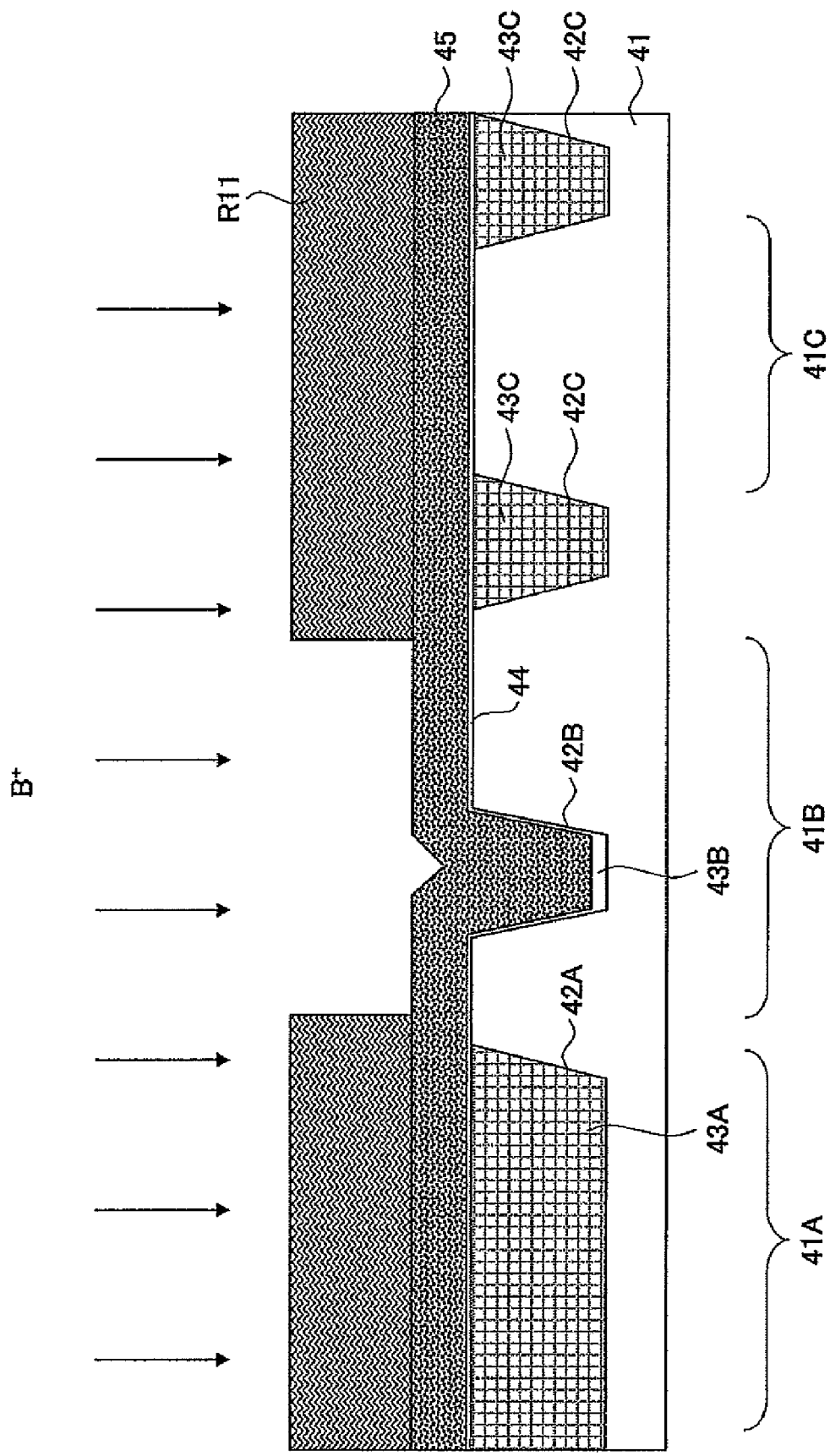

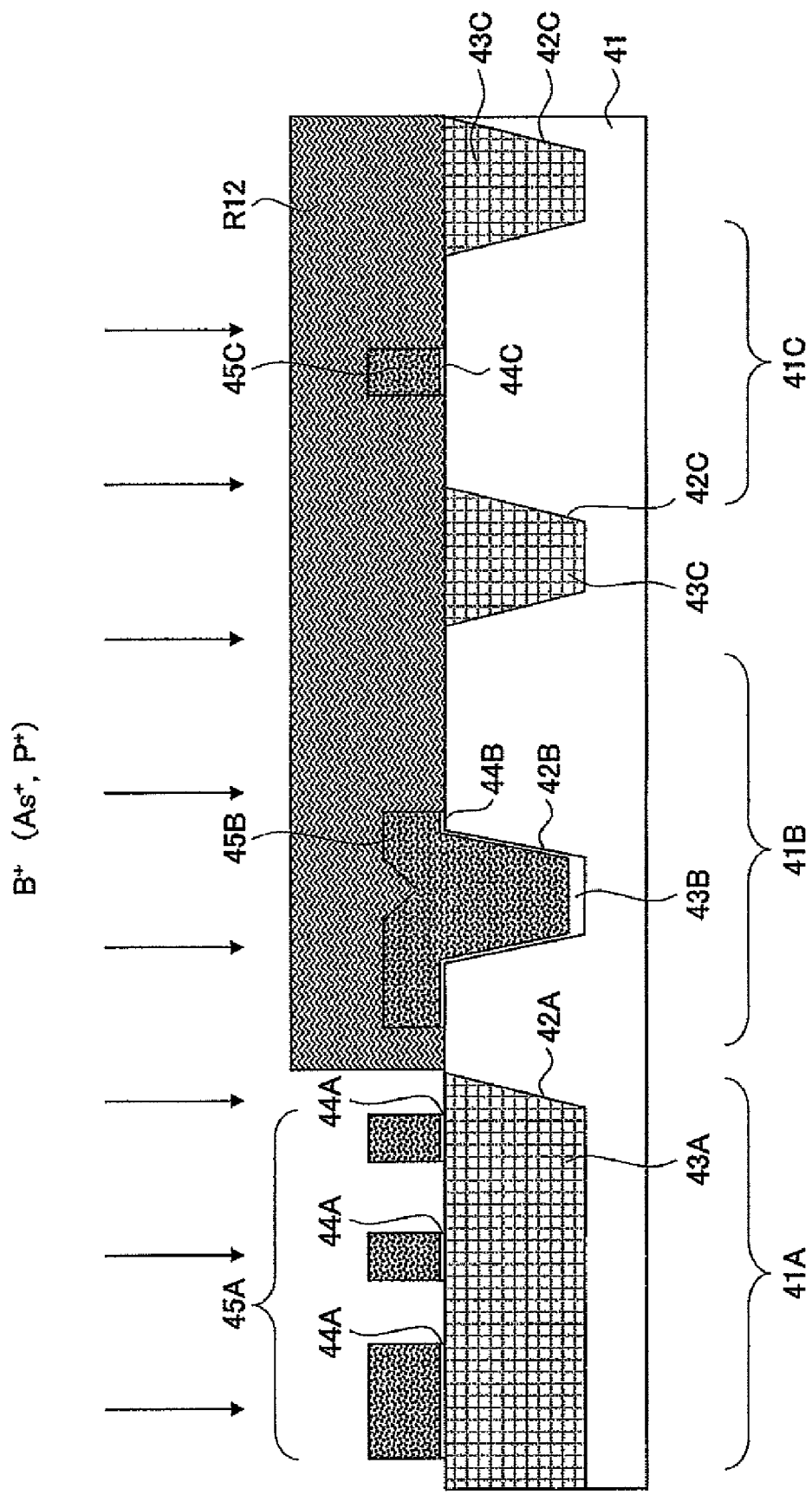

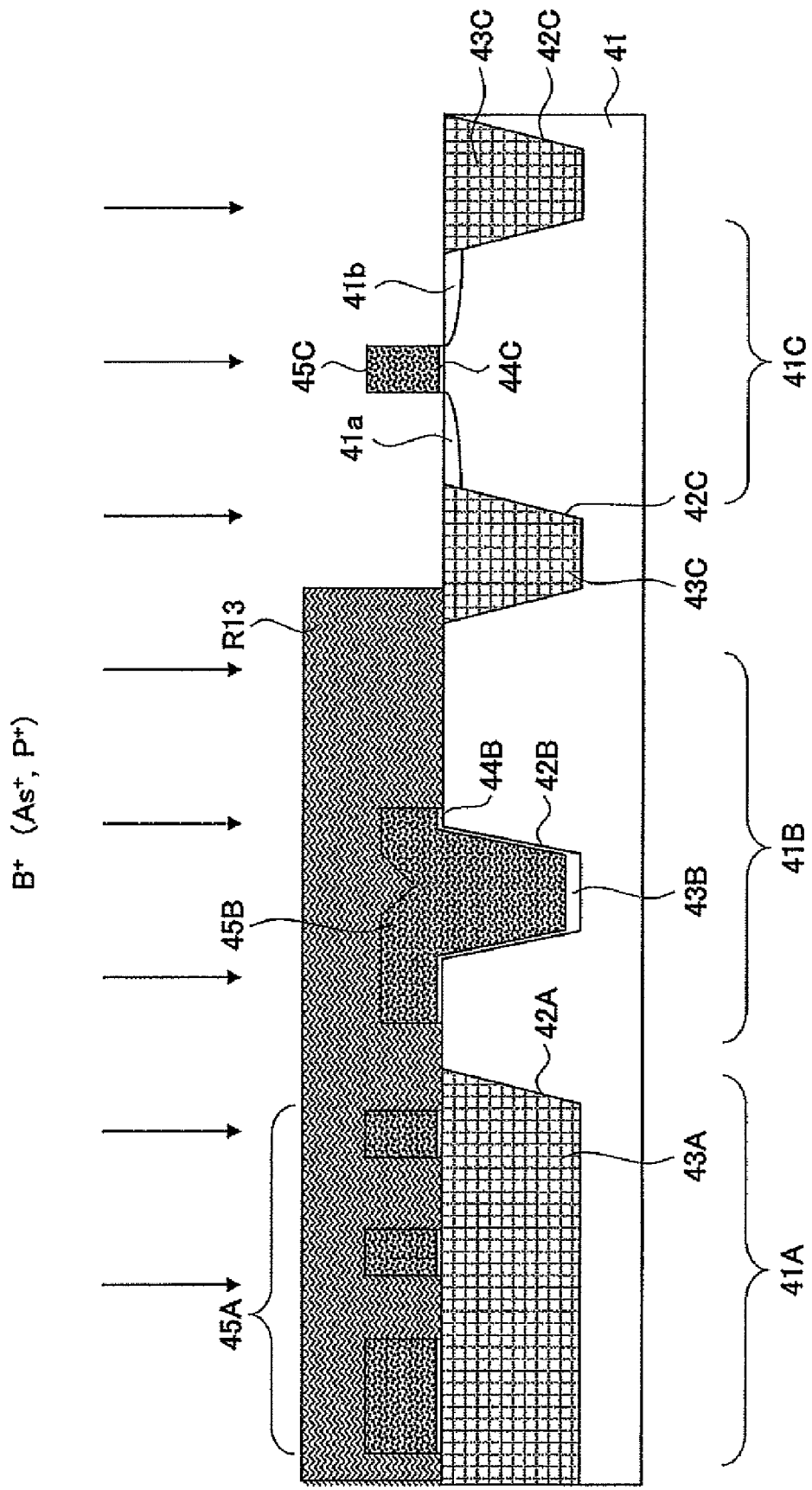

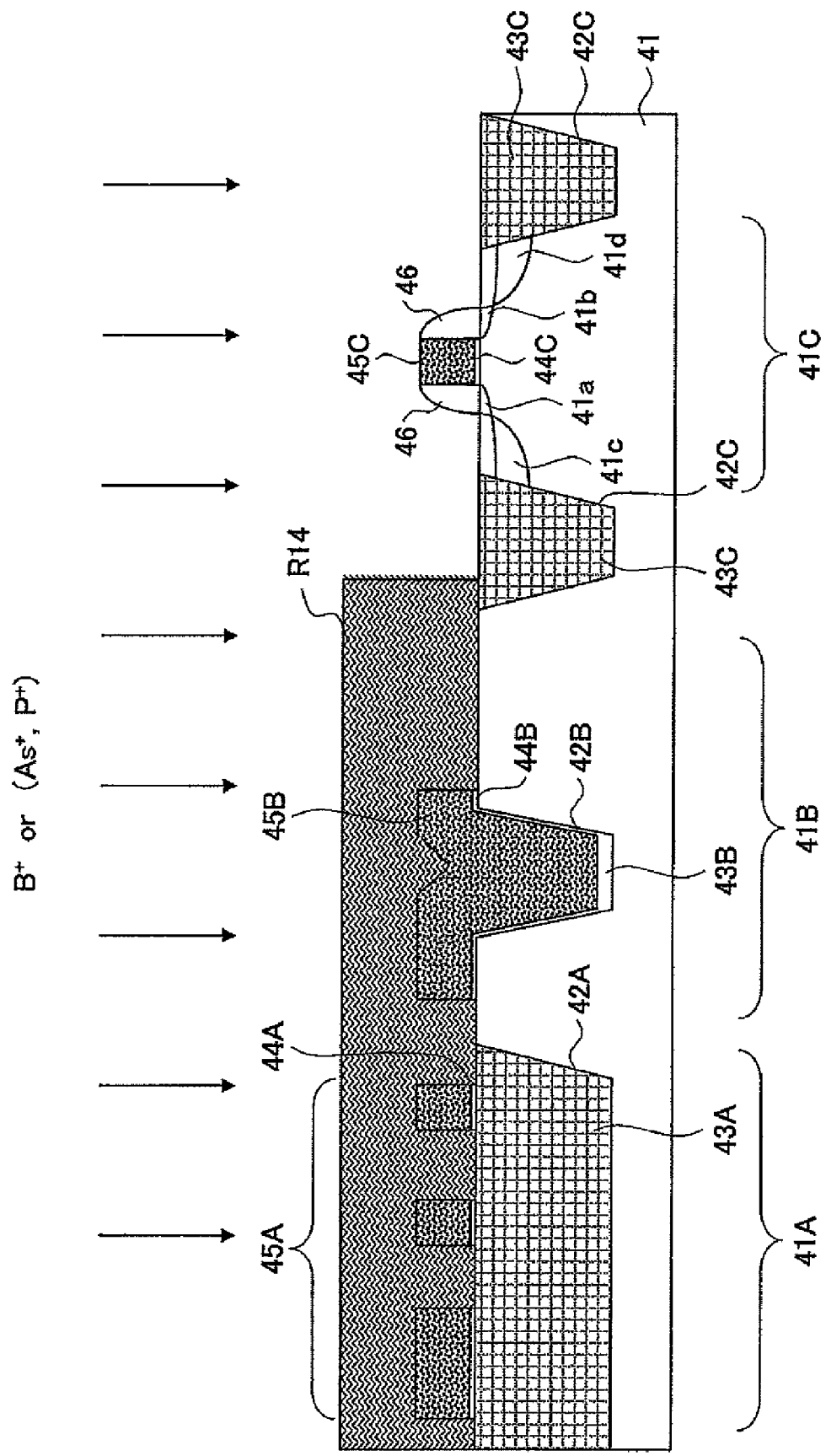

US 7,592,216 B2

FABRICATION PROCESS OF A SEMICONDUCTOR DEVICE HAVING A CAPACITOR

CROSS-REFERENCE TO RELATED APPLICATION

The present application is based on Japanese priority application No. 2007-265838 filed on Oct. 11, 2007, the entire contents of which are hereby incorporated by reference.

BACKGROUND OF THE INVENTION

The present invention generally relates to semiconductor devices and more particularly to the fabrication process of a semiconductor device in which a capacitor and a resistor are integrated.

Conventionally, semiconductor devices are used in which semiconductor device elements such as transistors are integrated on a semiconductor substrate together with capacitors and resistors. With such semiconductor devices, the capacitors are formed by utilizing trenches formed in the semiconductor substrate, while the resistors are formed as a polysilicon pattern on the semiconductor substrate.

With the capacitor of the type thus formed by using the trench formed at the surface of the semiconductor substrate, an oxide film is formed on the trench surface as a capacitor insulation film, and a polysilicon pattern is formed as a top electrode such that the polysilicon pattern fills the trench via the oxide film. With the capacitor of such a construction, there is a need for providing high conductivity to the polysilicon pattern filling the trench by doping with an impurity element to high concentration level up to the part filling the trench bottom.

SUMMARY OF THE INVENTION

In an aspect, a method of manufacturing a semiconductor device has forming a first trench in a capacitor device region of a semiconductor substrate, forming a capacitor insulation film over a sidewall surface of the first trench, forming a semiconductor film over the first trench, a resistor device region of the semiconductor substrate and a logic device region of the semiconductor substrate, introducing a first impurity element into the semiconductor film over the first trench, patterning the semiconductor film to form a top electrode in the capacitor device region, a resistor in the resistor device region and a gate electrode in the logic device region, annealing the semiconductor substrate, and then introducing a second impurity element in said resistor.

BRIEF DESCRIPTION OF THE DRAWINGS

FIGS. 5A-5C are diagrams showing a relationship between a variation of a resistance change and the product of the length and width of a pattern area according to the present invention;

FIGS. 8A-8K are diagrams showing the process of fabricating a semiconductor device according to a first embodiment of the present invention;

FIGS. 9A-9K are diagrams showing the process of fabricating a semiconductor device according to a second embodiment of the present invention.

DETAILED DESCRIPTION OF THE PREFERRED EMBODIMENT

FIGS. 1A-1F show the process of forming a capacitor in a semiconductor device according to a related art of the present invention.

Figure 1A:
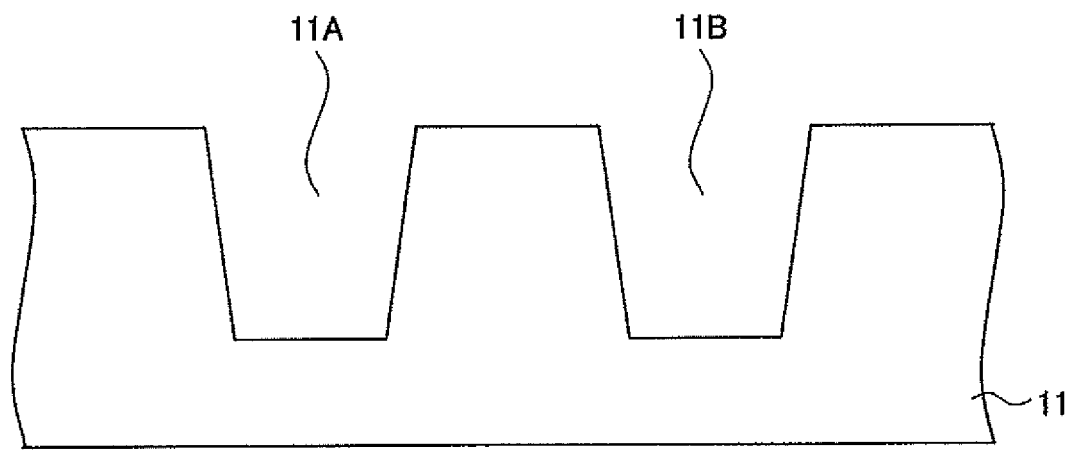
FIGS. 1A-1F are diagrams showing the process of fabricating a semiconductor device according to a related art of the present invention.
Figure 1B:
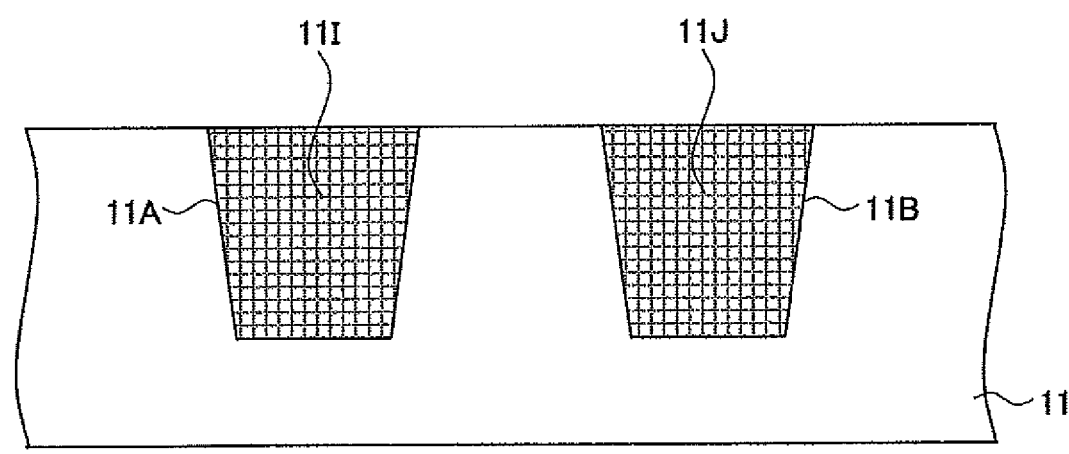

Referring to FIG. 1A, there is formed an isolation trench 11B in a silicon substrate simultaneously to formation of a device isolation trench 11A, and the device isolation trench 11A is filled with a device isolation insulation film 11I of $SiO_2$ in the step of FIG. 1B. At the same time, the trench 11B is filled with an insulation film 11J also of $SiO_2$.

Figure 1C:
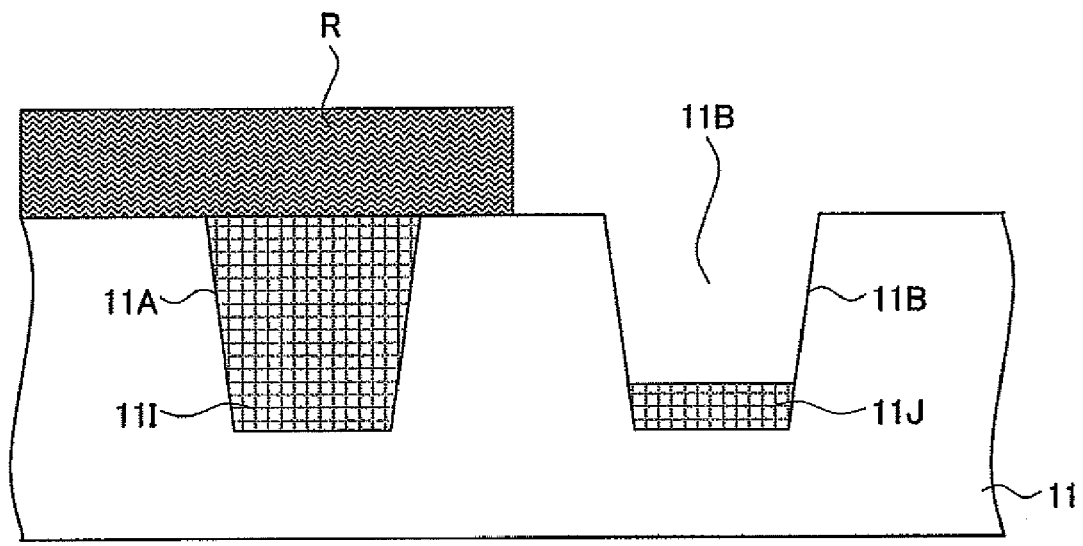

Further, in the step of FIG. 1C, the device isolation insulation film 11I is covered with a resist pattern R, and the insulation film 11J in the trench 11B is receded by conducting a wet etching process. Further in the step of FIG. 1D, there is formed an insulation film 12 by a thermal oxide film, for example, on the surface of the silicon substrate 11 such that the insulation film 12 covers the exposed surface of the trench 11B.

Figure 1D:
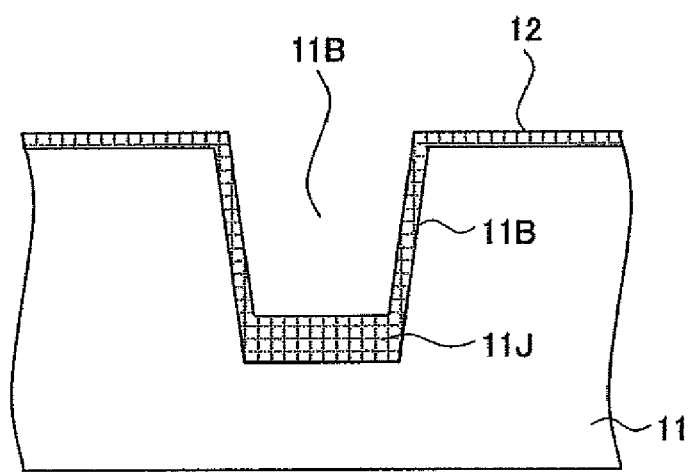
Figure 1E:
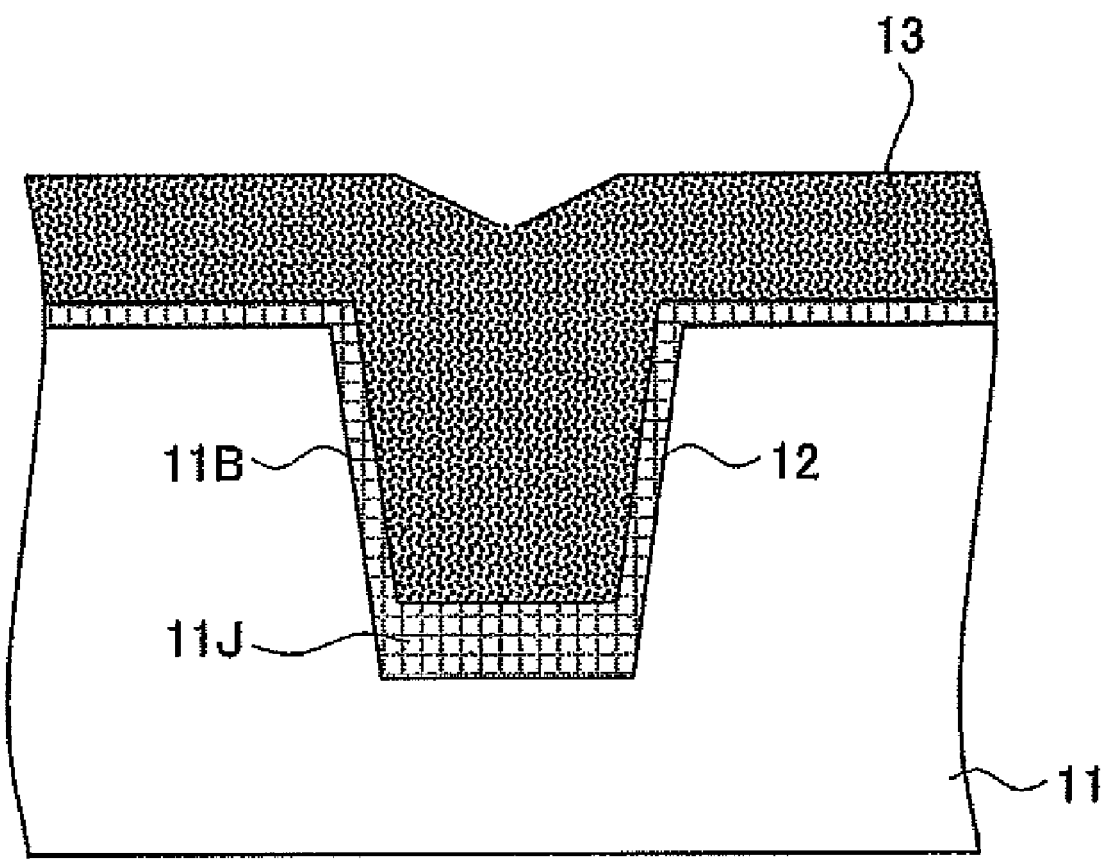

Further, in the step of FIG. 1E, there is deposited a polysilicon film 13 on the structure of FIG. 1D to fill the trench 11B.

With such a formation process of the capacitor, it is advantageous to form the insulation film 12 by the same insulation film that constitutes the gate insulation film of the semiconductor element (p-channel metal-oxide semiconductor (MOS) transistor or n-channel MOS transistor) formed on the device region (not shown), which is defined on the same semiconductor substrate 11 by the device isolation region 11I, for the purpose of reducing the number of process steps. Further, for the purpose of reducing the number of process steps, it is also advantageous to form the polysilicon top electrode 13 by the same polysilicon layer constituting the gate electrode of the transistor.

Meanwhile, with the highly miniaturized semiconductor devices in current use, it is practiced in the art, for purposes of facilitating threshold control, that the gate electrode of a p-channel MOS transistor formed on a semiconductor substrate is formed of a p-type polysilicon electrode and the gate electrode of an n-channel MOS transistor formed on the same semiconductor substrate is formed of an n-type polysilicon electrode. Thus, in the step of FIG. 1E, the polysilicon film 13 is generally formed in an undoped state, and the undoped polysilicon film thus deposited is doped later to n-type in the device region of the n-channel MOS transistor and to p-type in the device region of the p-channel MOS transistor by way of ion implantation process.

Figure 1F:
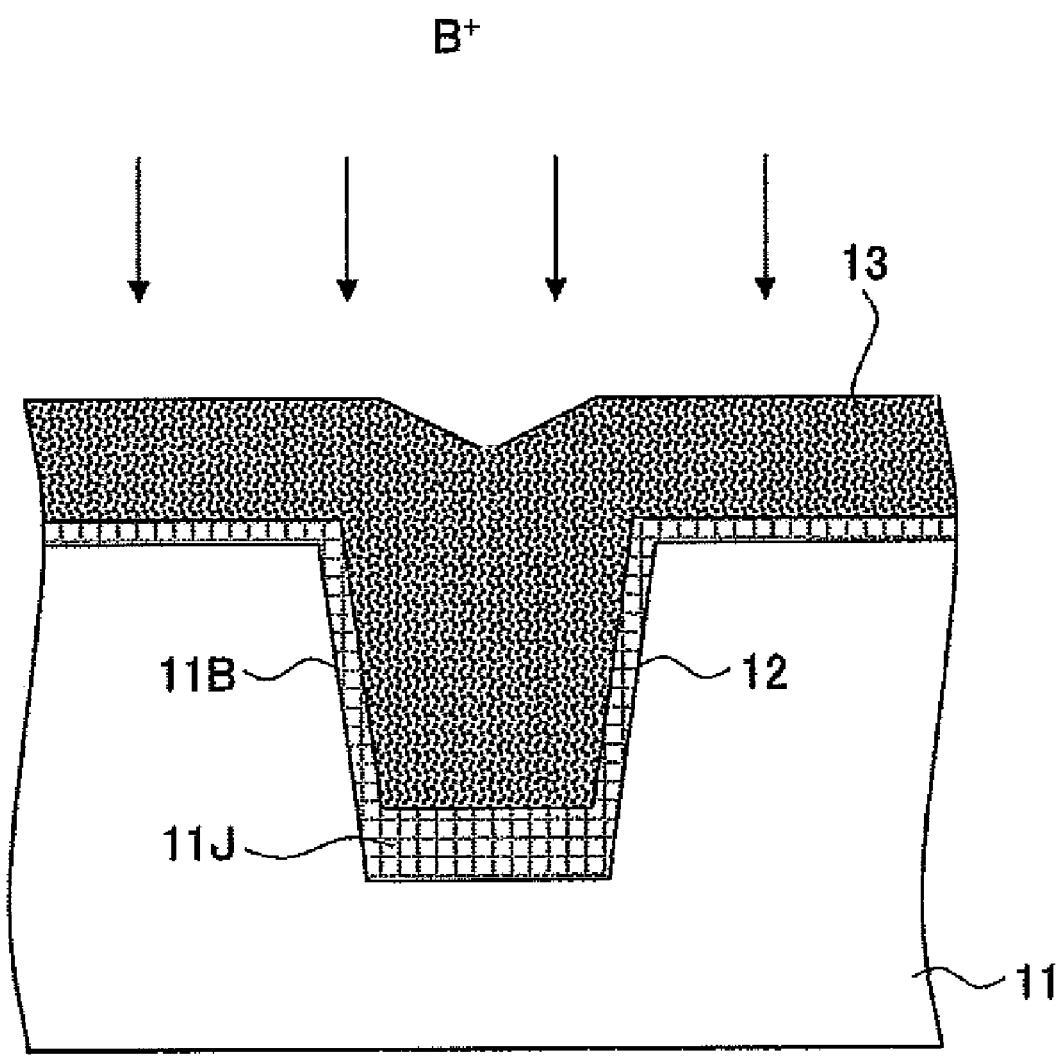

Thus, in the state of FIG. 1E, the polysilicon film 13 does not have substantial conductivity, and the conductivity is given in the step of FIG. 1F by introducing a dopant that causes fast diffusion, such as boron ions (B+), by way of ion implantation process.

Conventionally, it has been shown, with the capacitors of such a construction, that a capacitance of 1.5 fF is attained in the case of a device generation of a 0.25 μm design rule, where the trench 11B has a width of 0.25 μm.

With the semiconductor devices of the generation of further miniaturization, and thus of a more strict design rule, on the other hand, there is a need of increasing the depth of the trench 11B to compensate for a decrease of capacitance caused by miniaturization of the capacitors. Thus, there is a need of increasing the depth of the trench 11B to about 0.3 μm, for example, with the generation that uses the design rule of 0.1 μm, in which the width of the trench 11B is 0.1 μm.

Figure 2:
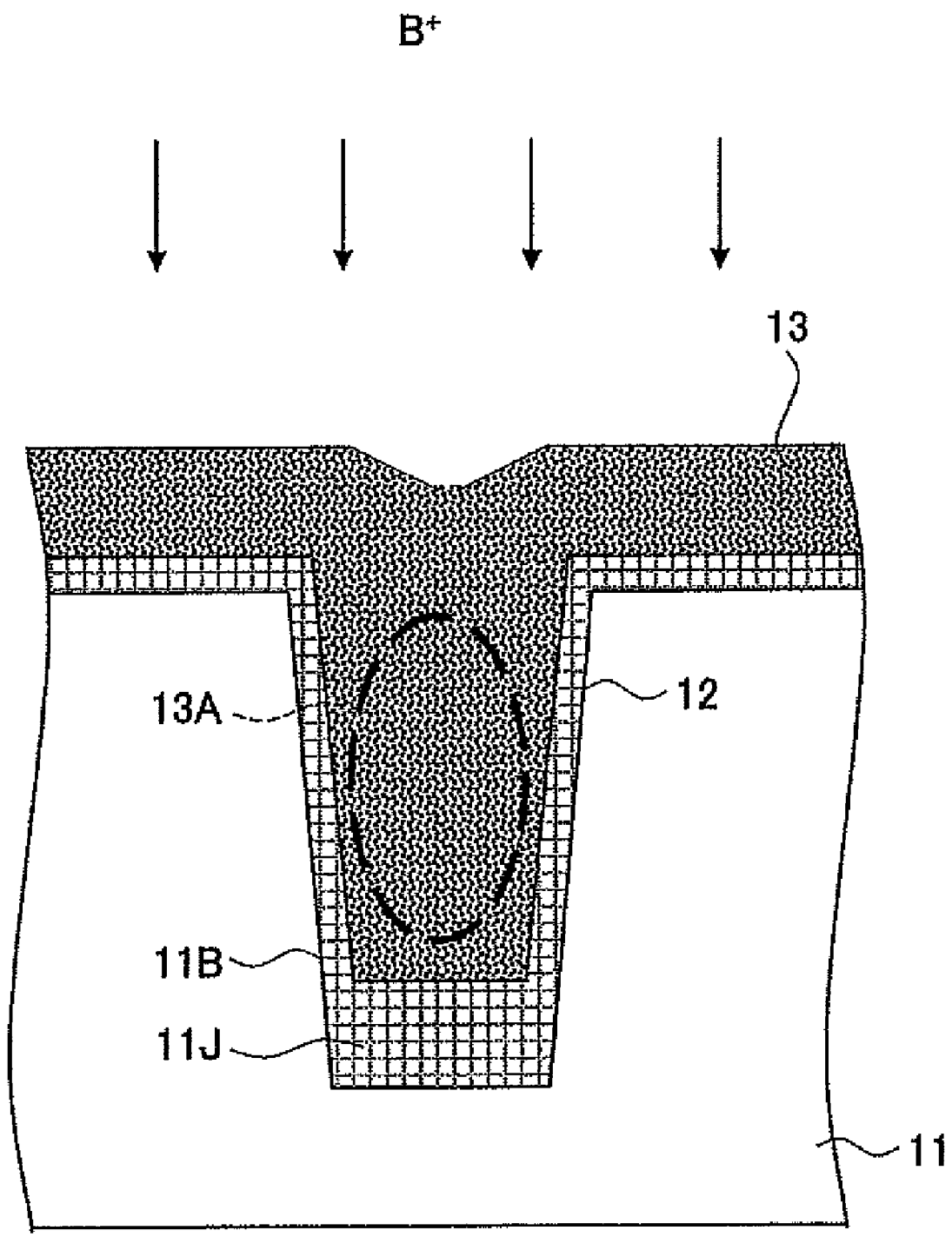
FIG. 2 is a diagram explaining the problems in the semiconductor device fabricated with the process of FIGS. 1A-1F.

On the other hand, the inventor of the present invention has discovered, in the investigations that constitute the foundation of the present invention, that there arises a situation that even a boron (B) dopant, which is known to have a relatively large diffusion coefficient, cannot reach the part of the polysilicon film filling the trench 11B substantially, and as a result, there arises depletion in the part of the polysilicon film 13 encircled in FIG. 2. In this investigation, it should be noted that experiments and simulations were conducted with regard to the ion implantation process of FIG. 1F while changing the acceleration energy and dose variously. Because of a lack of conductivity in such a part, the polysilicon film 13 cannot function as the effective top electrode of capacitor. This means that it is not possible to compensate for the decrease of capacitance associated with device miniaturization, even when the depth of the trench 11B is increased.

Thus, in order to solve the problem of depletion of the polysilicon film 13 filling the trenches 11B in the capacitor formed in such trenches 11B, the inventor of the present invention has conducted experiments, in the investigations that constitute the foundation of the present invention, by annealing the structure of FIG. 2 under various conditions.

In the experiments, there is formed a trench in a silicon substrate 11 with an n+ type well with an edge length of 0.1 μm and a depth of 0.3 μm, and an $SiO_2$ film was formed on the surface thereof as the a insulation film 12 with a film thickness of about 4 nm. Further, an undoped polysilicon film was deposited thereon as the polysilicon film 13 as shown in FIG. 2, and the ion implantation process of B was conducted under the acceleration voltage of 4 keV with a dose of $5.5 \times 10^{15}$ cm².

The structure thus obtained was then annealed under the following various conditions:

in Experiment A, no annealing was made (Comparative Reference);

in Experiment B, annealing was conducted for 3 seconds at 1000° C. in a nitrogen gas ambient;

in Experiment C, annealing was conducted for 0 seconds (only temperature rising and lowering were made, zero holding time) at 1050° C. in a nitrogen gas ambient;

in Experiment D, annealing was conducted for 3 seconds at 1025° C. in a nitrogen gas ambient;

in Experiment E, annealing was conducted for 3 seconds at 1025° C. in a nitrogen gas ambient;

in Experiment F, annealing was conducted for 10 seconds at 1000° C. in a nitrogen gas ambient; and in Experiment G, annealing was conducted for 3 seconds at 1050° C. in a nitrogen gas ambient.

Figure 3:
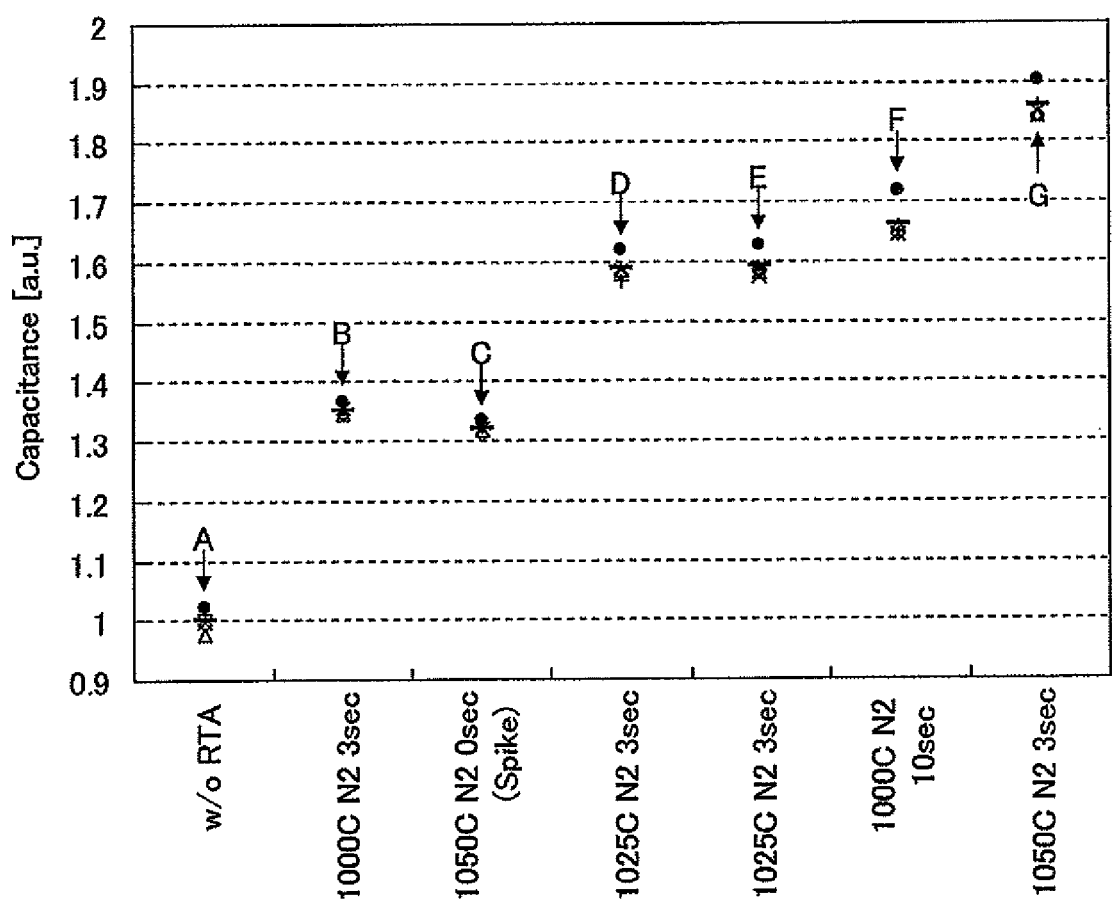
FIG. 3 is a diagram explaining the effect of diffusion of an impurity element caused by a thermal annealing process.

FIG. 3 shows the change of capacitance of the capacitors caused as a result of such thermal annealing processes with regard to the Comparative Example.

Referring to FIG. 3, it can be seen that, in the Experiment A corresponding to the Comparative Reference, there is realized the capacitance value of about 0.95 fF, while FIG. 3 indicates that this capacitance value can be increased by conducting thermal annealing process. Particularly, with the specimens of the Experiments D, E, F and G, it can be seen that there is attained an increase of capacitance value of more than 60% as compared with the resistance value of the Comparative Reference. Thus, with these specimens, practical capacitance values were attained Obviously, this has been the result that B atoms introduced into the polysilicon film 13 reach the part near the bottom of the trench 13 by diffusion which is caused by the thermal annealing process. As a result, the problem of depletion is eliminated or reduced and the polysilicon film 13 has uniform conductivity.

Thus, it has been confirmed that the problem of depletion can be resolved successfully even in the capacitors formed in the trenches with large aspect ratios as shown in FIG. 2, by performing the thermal annealing process.

On the other hand, the inventor of the present invention has discovered that, in the case where resistor patterns are formed over the silicon substrate 11 by the polysilicon film 13, a variation of resistance value is induced for these resistor patterns when such thermal annealing process is conducted. The discovery of this problem leads to the concern that normal operation may not be attained with such semiconductor devices.

Figure 4A:
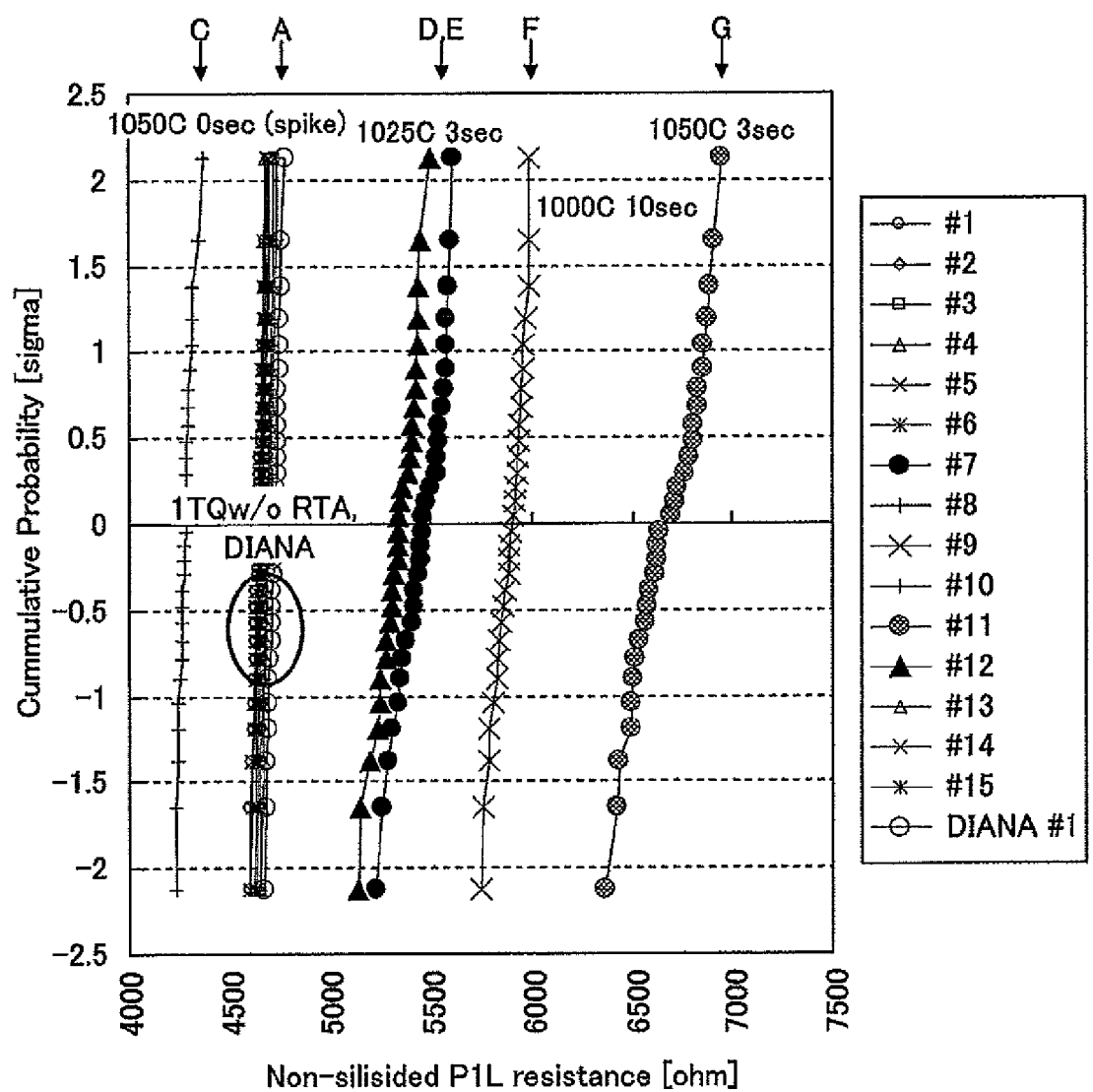
FIGS. 4A and 4B are diagrams showing the change of resistance value caused with the thermal annealing process.
Figure 4B:
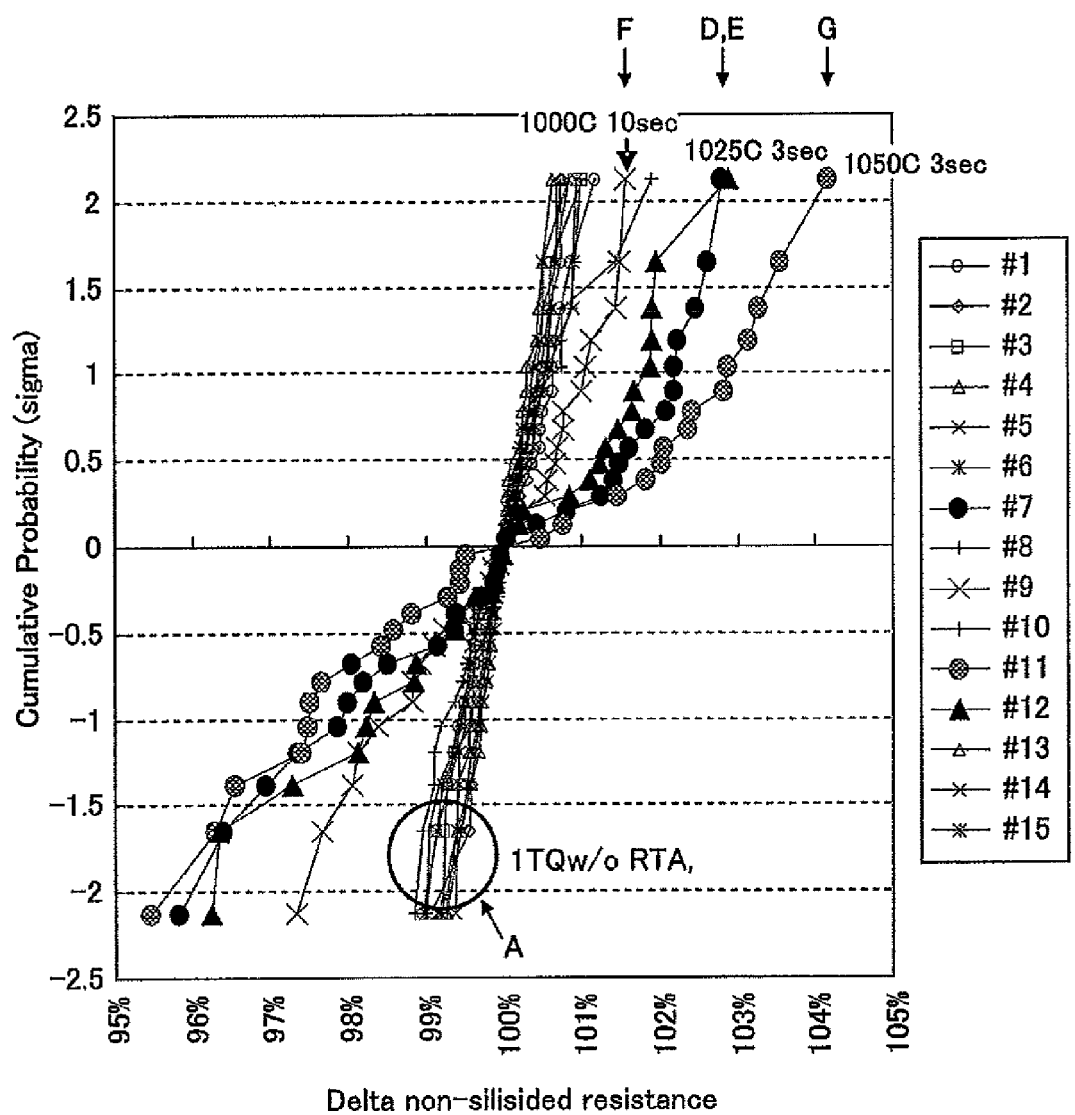

FIGS. 4A and 4B show the distribution and variation of the resistance values obtained for the specimens of the Experiments A-G of FIG. 3.

In the experiments shown in FIGS. 4A and 4B, it should be noted that B (boron) is introduced into the polysilicon film 13 formed on the silicon substrate under the acceleration voltage of 8 keV with a dose of $4.5 \times 10^{15}$ cm$^{-2}$.

Referring to FIGS. 4A and 4B, it can be seen that there is not only an increase of resistance value but also an increase of variation of the resistance values in the specimens subjected to the thermal annealing process, as compared with the case of Comparative Reference A.

For example, it can be seen that the resistance value of about 4.6 kΩ obtained for the Comparative Reference has increased to 6.7 kΩ with the specimen of the experiment G as a result of the thermal annealing process. Associated therewith, the variation of the resistance is increased, in terms of the 2σ value, from +/−1% or less for the case of the Comparative Reference A to +/−4% for the case of the Experiment G.

It is believed that such a change of resistance value of the polysilicon pattern is caused by an escape of B from the polysilicon film as a result of the thermal annealing process.

It is believed that a similar variation of resistance value would be induced in the polysilicon gate electrode patterns of the p-channel MOS transistors, which are doped with B.

Thus, in a first aspect, an embodiment of the present invention provides a method for fabricating a semiconductor device that includes the steps of: forming a first trench part in a capacitor device region of a semiconductor substrate, forming a capacitor insulation film on a sidewall surface of the first trench part, forming a semiconductor film so as to cover the first trench part, a resistor device region of the semiconductor substrate and a logic device region of the semiconductor substrate, introducing a first impurity element into the semiconductor film in a part over the first trench part, patterning the semiconductor film to form a top electrode pattern in the capacitor device region, a resistor pattern in the resistor device region and a gate electrode pattern in the logic device region, annealing the semiconductor substrate, and then introducing a second impurity element in said resistor pattern.

In another aspect, an embodiment of the present invention provides a method for fabricating a semiconductor device that includes the steps of: forming a first trench part in a capacitor device region of a semiconductor substrate, forming a capacitor insulation film on a sidewall surface of the first trench part, depositing a semiconductor film so as to cover the first trench part, a resistor device region of the semiconductor substrate and a logic device region of the semiconductor substrate, introducing a first impurity element into the semiconductor film, annealing said semiconductor substrate, patterning the semiconductor film to form a top electrode pattern in the capacitor device region, a resistor pattern in the resistor device region and a gate electrode pattern in the logic device region, and introducing a second impurity element in the resistor pattern.

According to the embodiment of the present invention, it becomes possible, in the semiconductor devices having a trench part for the capacitor device region, to dope an amorphous silicon film or a polysilicon film formed so as to fill the trench part, with an impurity element with a high concentration level up to the part covering the bottom part of the trench part, by conducting a thermal annealing process, even in the case where the semiconductor device is a highly miniaturized semiconductor device and the trench part of the capacitor device region has a large aspect ratio.

Further, according to the embodiment of the present invention, it becomes possible to effectively compensate for the decrease of capacitance value of the capacitors as in the case of the semiconductor device of the related art as a result of escape from the polysilicon top electrode pattern.

Thereby, the problem of the escape of the impurity element from the resistor patterns of amorphous silicon or polysilicon previously, caused by such a thermal annealing process, can be effectively avoided, by carrying out the process of introducing the second impurity element into the amorphous silicon or polysilicon resistor pattern after conducting the thermal annealing process. As a result, the problem of the variation of the polysilicon resistor patterns formed in the resistor device region after the thermal annealing process is suppressed effectively.

Particularly, by carrying out the patterning process of the resistor pattern of amorphous silicon or polysilicon before conducting the thermal annealing process, the patterning process to the amorphous silicon film or polysilicon film is conducted in the state in which crystal grain growth is not yet caused in the amorphous silicon film or the polysilicon film. Thereby, it becomes possible to carry out the patterning while using a dry etching recipe, which is used for patterning ordinary amorphous silicon films or polysilicon films.

Figure 5A:
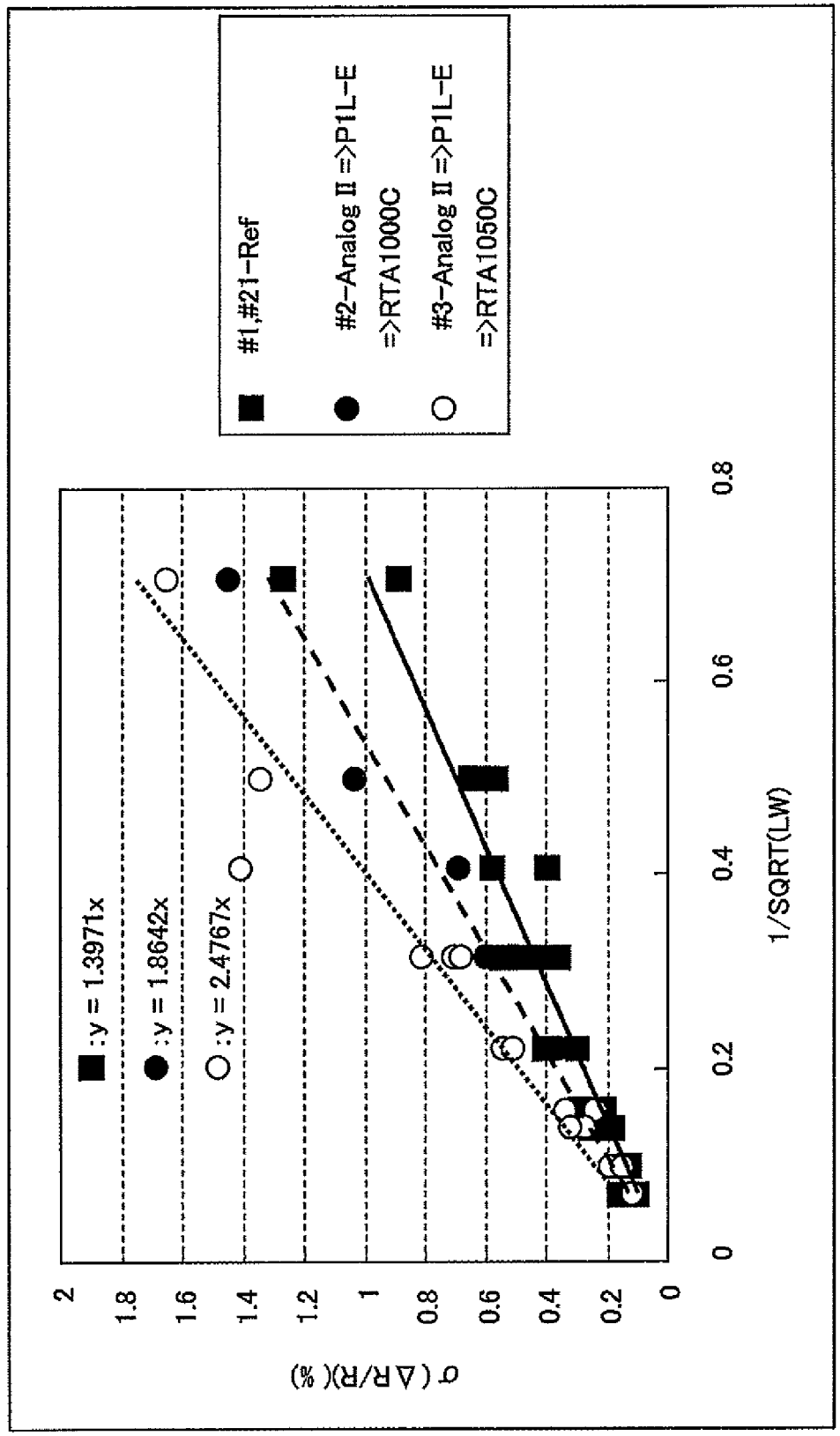
Figure 6:
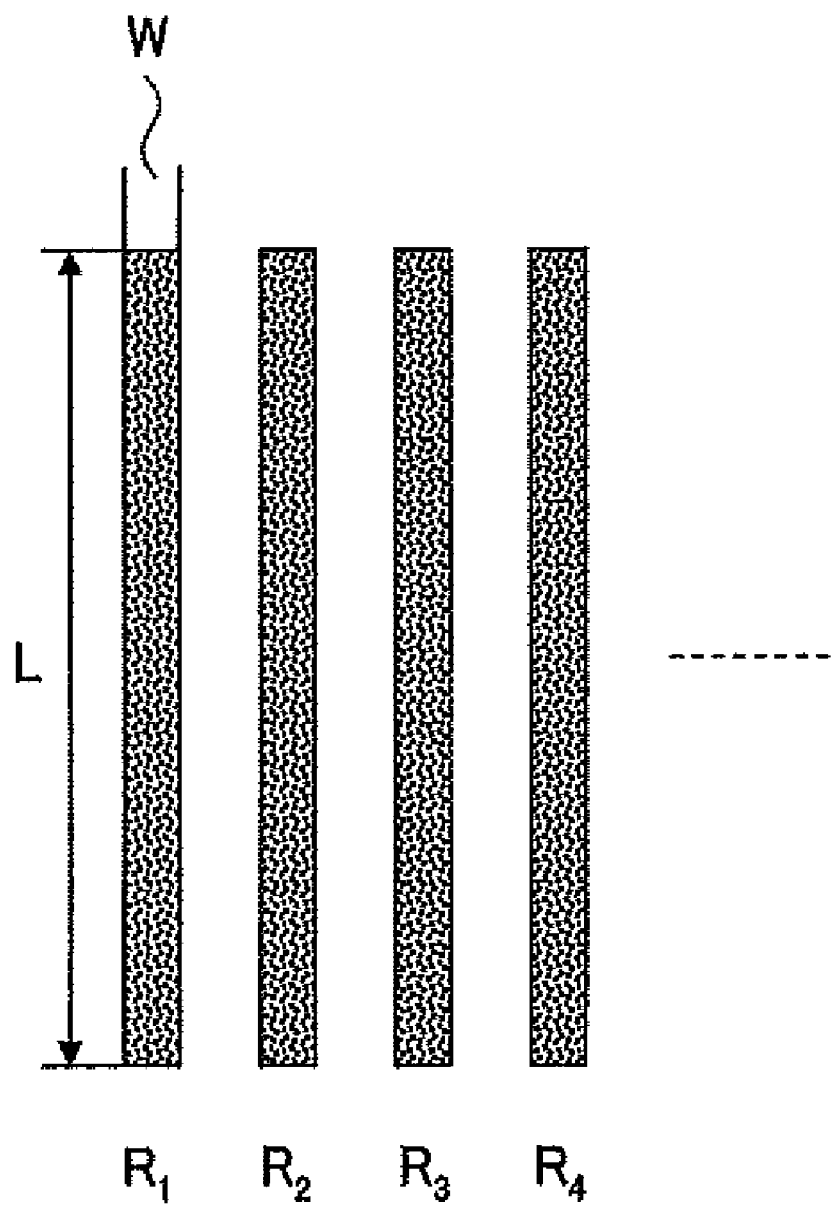
FIG. 6 is a diagram showing the specimen used with the experiments of FIGS. 5A-5C.

FIG. 5A corresponds to the related art of the present invention and represents the variation a of the resistance change $\Delta R$, which has been caused between a pair of mutually adjacent polysilicon patterns in the structure shown in FIG. 6 in which a large number of polysilicon patterns are formed side by side, each with a width W and a length L. In FIG. 5A, the vertical axis represents the variation $\sigma$, while the horizontal axis represents the inverse of the root of the pattern area L·W (1/SQRT(L·W)). Here, it should be noted that the variation $\sigma$ represents the variation of the resistance change $\Delta R$ as normalized to the average resistance R ($\Delta R/R$). In the specimen of FIG. 6, for example, the normalized resistance change $\Delta R/R$ is calculated, for the pattern having the resistance value R1 and the adjacent pattern having the resistance value R2, as $\Delta R/R=(R1-R2)/\{\frac{1}{2}(R1+R2)\}$.

In FIG. 5A, it should be noted that the smaller the value of the horizontal axis becomes, the larger the area of the resistor pattern becomes. Likewise, the larger the value of the horizontal axis becomes, the smaller the area of the resistor pattern becomes.

It should be noted that, in the experiment of FIG. 6, a thermal oxide film is formed on the surface of a silicon substrate, followed by formation of an undoped polysilicon film by a chemical vapor deposition (CVD) process at the substrate temperature of 605° C. for the thickness of 105 nm, and B+ is introduced thereafter by an ion implantation process under the acceleration voltage of 8 keV with a dose of 4.5× $10^{15}$ cm$^{-2}$.

There, the specimen indicated by solid squares represent the comparative reference, in which the polysilicon pattern thus obtained is not subjected to a thermal annealing process except for the thermal annealing process conducted for activating the impurity element.

On the other hand, the specimen indicated by solid circles in FIG. 5A represent the specimen in which patterning was made to the polysilicon film to form the resistor patterns of FIG. 6 after the ion implantation process of B (boron), and further a thermal annealing process was applied thereafter at the temperature of 1000° C. for 10 seconds (corresponds to Specimen F of FIGS. 4A and 4B). There, the ion implantation process was conducted under the condition as noted above.

Further, the specimen indicated by open circles in FIG. 5A represent the specimen in which patterning was made to the polysilicon film to form the resistor patterns of FIG. 6 after the ion implantation process of B (boron), followed further with a thermal annealing process at the temperature of 1050° C. for 3 seconds (corresponds to Specimen G of FIGS. 4A and 4B). Again, the ion implantation process was conducted under the condition as noted above.

Referring to FIG. 5A, in the case the patterning of the polysilicon resistor patterns of FIG. 6 is made with a constant precision, a plot was expected that would show a general tendency that the variation $\sigma$ of the resistance value increases with increasing value of the horizontal axis, and hence with decreasing pattern area. In fact, such a tendency can be observed for some of the specimens represented by solid squares, solid circles and open circles.

On the other hand, with the specimen represented by solid squares and solid circles, one can be also see that the specimen subjected to the thermal annealing process shows a tendency that the variation $\sigma$ of the resistance value is larger than the variation of the comparative reference, in conformity with the relationship of FIG. 4B.

In FIG. 5B, the vertical axis and the horizontal axis are identical to those of FIG. 4A and the same comparative reference specimen as in the case of FIG. 5A are also represented by the solid squares.

In FIG. 5B, however, it should be noted that the solid circles represent the specimen in which the polysilicon film is first annealed at the temperature of 1000° C. for 10 seconds, followed by introducing B+ thereto by an ion implantation process under the same conditions as in the case of FIG. 5A. Further, the patterning of the polysilicon film to form the resistor patterns of FIG. 6 was conducted thereafter.

Likewise, the open circles represent the experiments in which the polysilicon film is first annealed at the temperature of 1050° C. for 3 seconds, followed by introducing B+ thereto by an ion implantation process under the same conditions as in the case of the experiment of FIG. 5A, and the patterning of the polysilicon film to the resistor patterns of FIG. 6 is conducted thereafter.

Referring to FIG. 5B, it can be seen that the variation $\sigma$ of the resistance value has become smaller compared with the variation of the resistance value of the comparative reference specimen. With this specimen, it should be noted that the ion implantation process was conducted after the thermal annealing process at 1000° C. or 1050° C.

For example, with the specimen represented by solid circles, the relationship between a and 1/SQRT(L·W) is represented as y=1.8642x for the case of the experiments of FIG. 5A, while in the experiments of FIG. 5B, the foregoing relationship is represented by y=1.324x. Here, y corresponds to the term σ and x corresponds to the term 1/SQRT(LW), Further, in the example of the specimen represented by the open circles, the relationship between the term σ and the term 1/SQRT (LW) is represented as y=2.4767x for the case of the experiments of FIG. 5A, while in the case of the experiments of FIG. 5B, the foregoing relationship is represented by y=1.1626x. Again, y corresponds to σ and x corresponds to 1/SQRT (LW). For the comparative reference specimen represented by the solid squares, the relationship between the term σ and the term 1/SQRT (LW) is represented as y=1.3971x for any of FIGS. 5A and 5S.

Figure 5C:
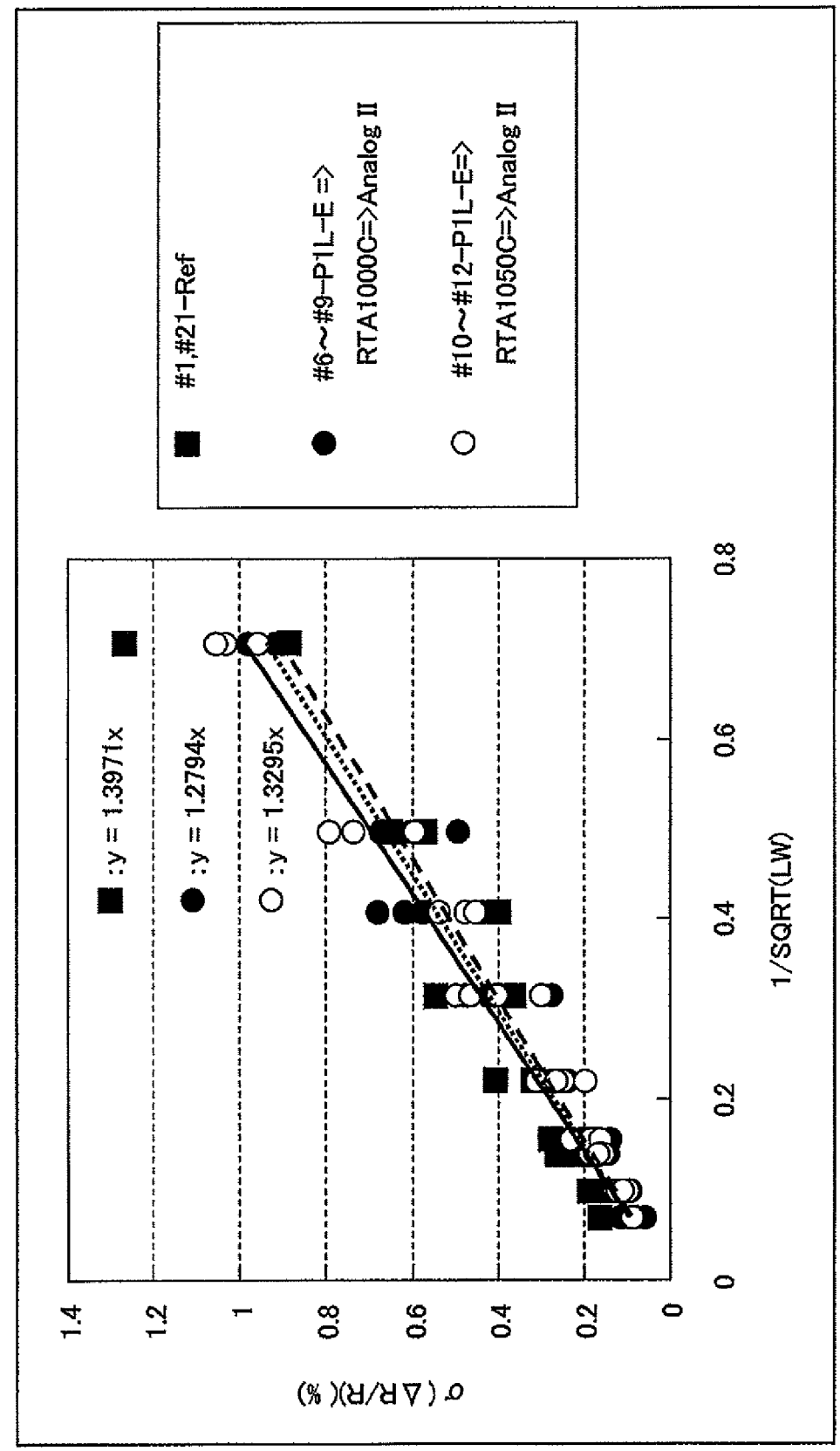

In FIG. 5C, the same vertical axis and the same horizontal axis are used as in the case of FIGS. 5A and 5B, and the same comparative reference as in the case of FIGS. 5A and 5B are plotted similarly by the solid squares.

Here, it should be noted that the solid circles represent the specimen in which the polysilicon film is patterned at first to form the resistor patterns shown in FIG. 6, followed by a thermal annealing process at the temperature of 1000° C. for 10 seconds, and ion implantation of B+ is conducted thereafter under the conditions similar to the experiments of FIG. 5A. Further, the open circles represent the specimen in which the polysilicon film is patterned at first to form the resistor patterns shown in FIG. 6, followed by a thermal annealing process at the temperature of 1050° C. for 3 seconds, and ion implantation of B+ is conducted thereafter under the condition similar to the experiments of FIG. 5A.

Referring to FIG. 5C, it can be seen that the variation σ of the resistance value has become smaller, in the specimen in which the ion implantation process is conducted after the thermal annealing process at 1000° C. or 1050° C., as compared with the comparative reference specimen.

In the example of the specimen represented with the solid circles in FIG. 5C, the relationship between σ and 1/SQRT (L·W) is represented as y=1.8642x, wherein y corresponds to the term σ and x corresponds to the term 1/SQRT(L·W), for the case of the experiments of FIG. 5A, while for the experiments of FIG. 5C, the foregoing relationship is represented by y=1.2794x. Further, in the example of the specimen represented by the open circles, the relationship between the term σ and the term 1/SQRT(L·W) is represented as y=2.4767x in experiments of FIG. 5A, while in the case of the experiments of FIG. 5C, the foregoing relationship is represented by y=1.3295x. With regard to the comparative reference specimen represented by the solid squares, the relationship between the term σ and the term 1/SQRT (L·W) is represented as y=1.3971x for any of FIGS. 5A and 5C.

Thus, it can be seen that the variation σ of the resistance change becomes smaller in the specimen in which the ion implantation process and patterning process are conducted after the thermal annealing process at 1000° C. or 1050° C., as compared with the variation of the resistance value for the comparative reference specimen.

Figure 7:
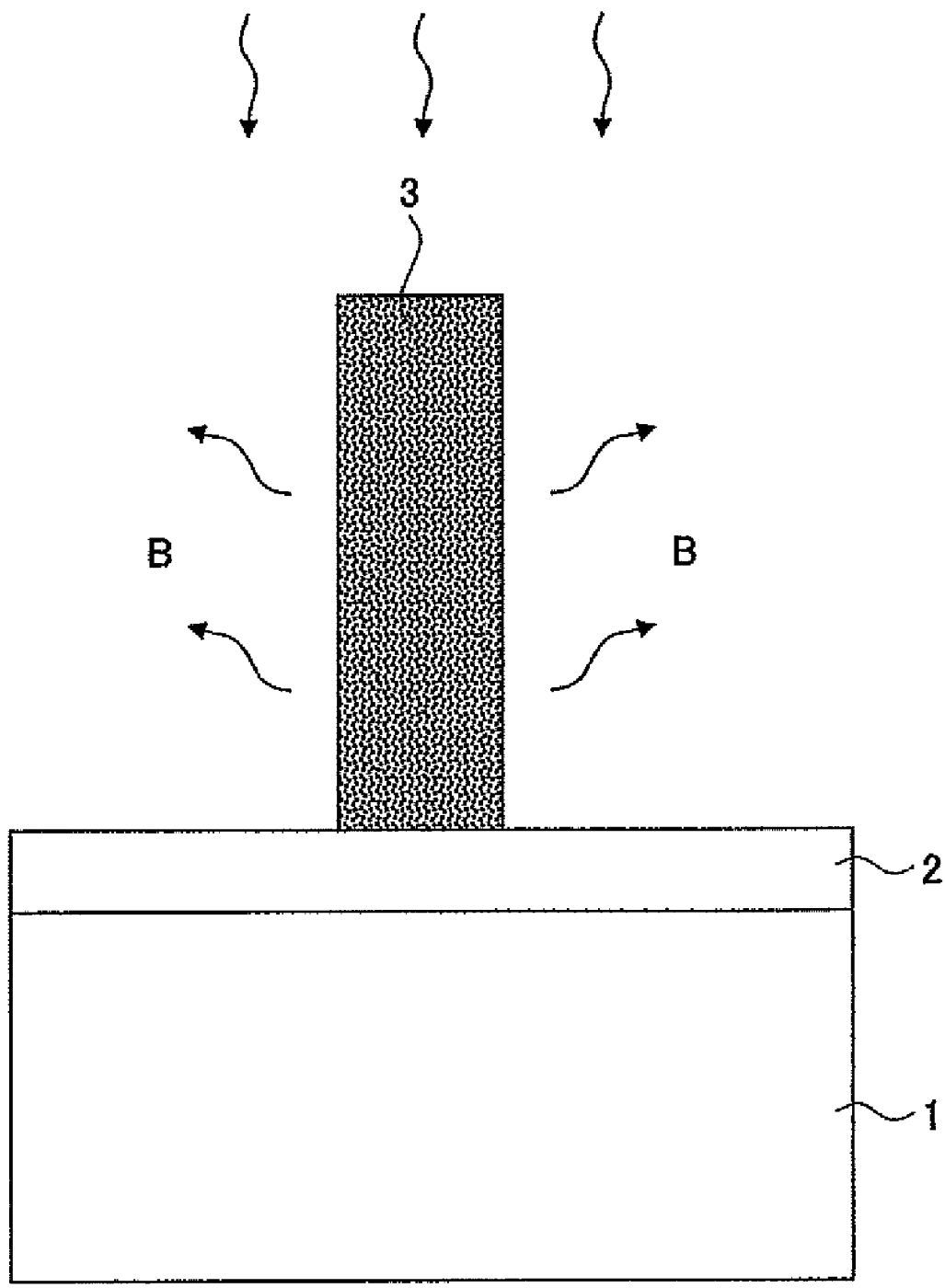
FIG. 7 is a diagram showing the cause of the variation of resistance value.

FIG. 7 is a diagram showing the mechanism that causes the foregoing difference of variation for the resistance value of the polysilicon resistor patterns between the case of the experiments of FIG. 5A and the case of the experiments of FIG. 5B or FIG. 5C.

Referring to FIG. 7, it can be seen that there is formed a polysilicon resistor pattern 3 on the silicon substrate 1 over an insulation film 2 of silicon oxide film, or the like, wherein there is an escape of the impurity element. The impurity element has been introduced previously into the polysilicon resistor pattern 3, when the polysilicon pattern was subjected to a thermal annealing process (RTA), as in the case of the thermal diffusion process explained with reference to FIG. 3.

Such escape of the impurity element from the polysilicon film appears particularly conspicuous for the case of using B for the impurity element.

FIGS. 8A-8K are diagrams showing the process of fabricating a semiconductor device according to a first embodiment of the present invention.

Figure 8A:
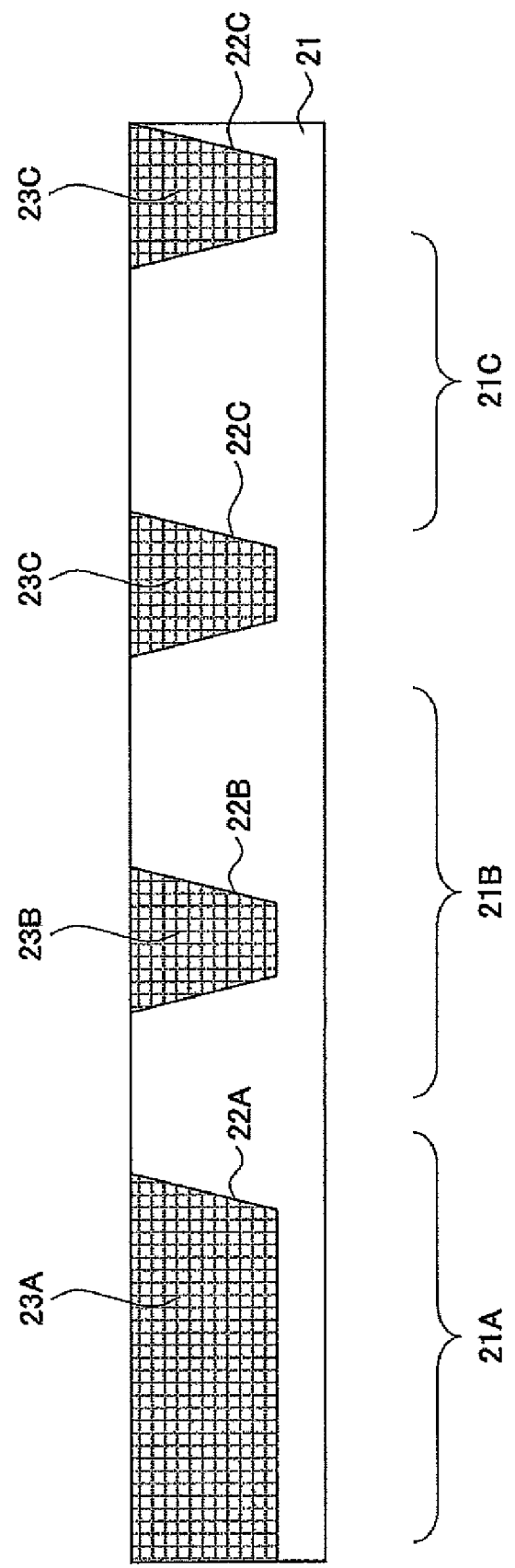

Referring to FIG. 8A, there are defined a resistor device region 21A, a capacitor device region 21B and a logic device region 21C on a silicon substrate 21. A trench part 22A, a trench part 22B and a device isolation trench 22C are formed simultaneously, respectively, in the resistor device region 21A, the capacitor device region 21B and the logic device region 21C.

In one example, the trench part 22B and the device isolation trench 22C are formed, in accordance with a design rule, such that the trench part 22B and the device isolation trench 22C have a width of 0.08-0.25 μm at the surface of the silicon substrate 21 and a depth of 0.2-0.35 μm.

The trench parts 22A and 22B and the device isolation trench 22C are filled respectively with CVD oxide films 23A, 238 and 23C, wherein excessive silicon oxide film at the surface of the silicon substrate 21 is removed by chemical mechanical polishing (CMP) process.

Next, in the step of FIG. 8B, the resistor device region 21A and the logic device region 21C are covered with a resist pattern (not shown), and an etch-back process is conducted to the exposed capacitor device region 21B in order to etch back the silicon oxide film therein by a dry etching process. With this, the CVD oxide film 23B is receded at the trench 22B until the CVD oxide film 23B is left at the bottom of the trench 23B with a thickness of about 30-100 nm. Further, in this step, ion implantation of a p-type element such as B+, or if necessary an n-type element such as arsenic ions (As+) or phosphorous ions (P+), is conducted into the capacitor device region 21B, and width this, a conductive well 21W is formed as the bottom electrode of the capacitor. In the explanation below, illustration of the conductive well 21W will be omitted.

Figure 8C:
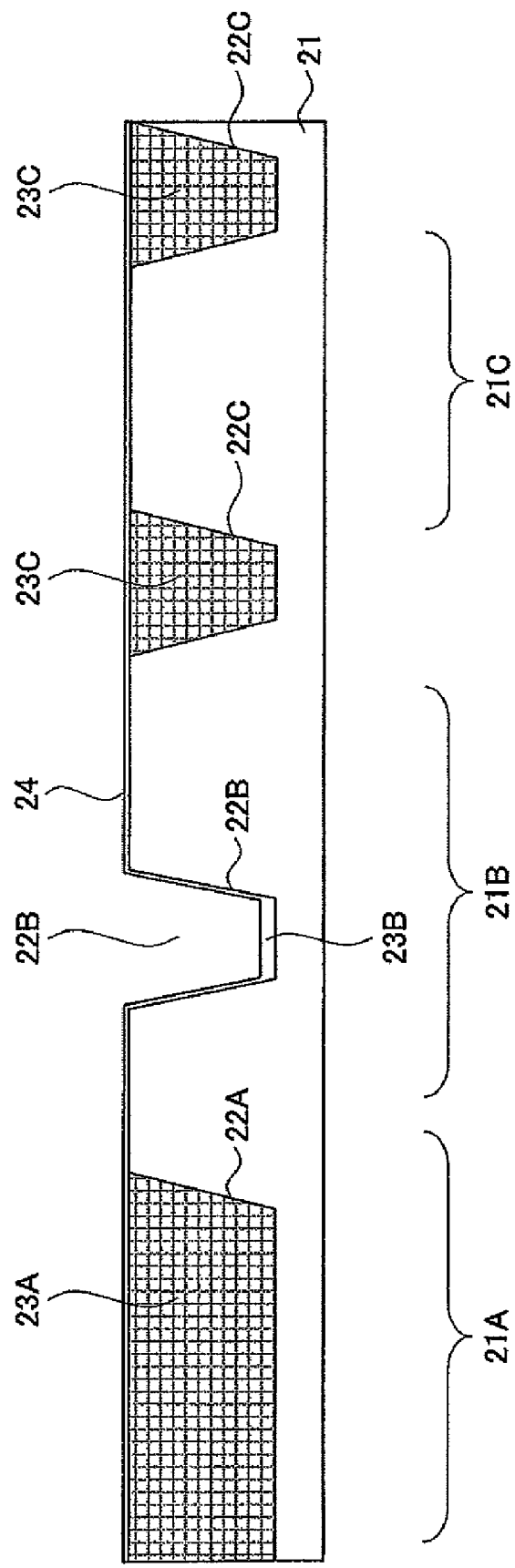

Next, in the step of FIG. 8C, a thermal oxidation process is conducted to for the structure of FIG. 8B in an oxygen ambient at the temperature of 1000° C., for example, and with this, a thermal oxide film 24 is formed on the surface of the silicon substrate 21 including the exposed sidewall surface of the trench part 22B with a thickness of 2 nm, for example.

Figure 8D:
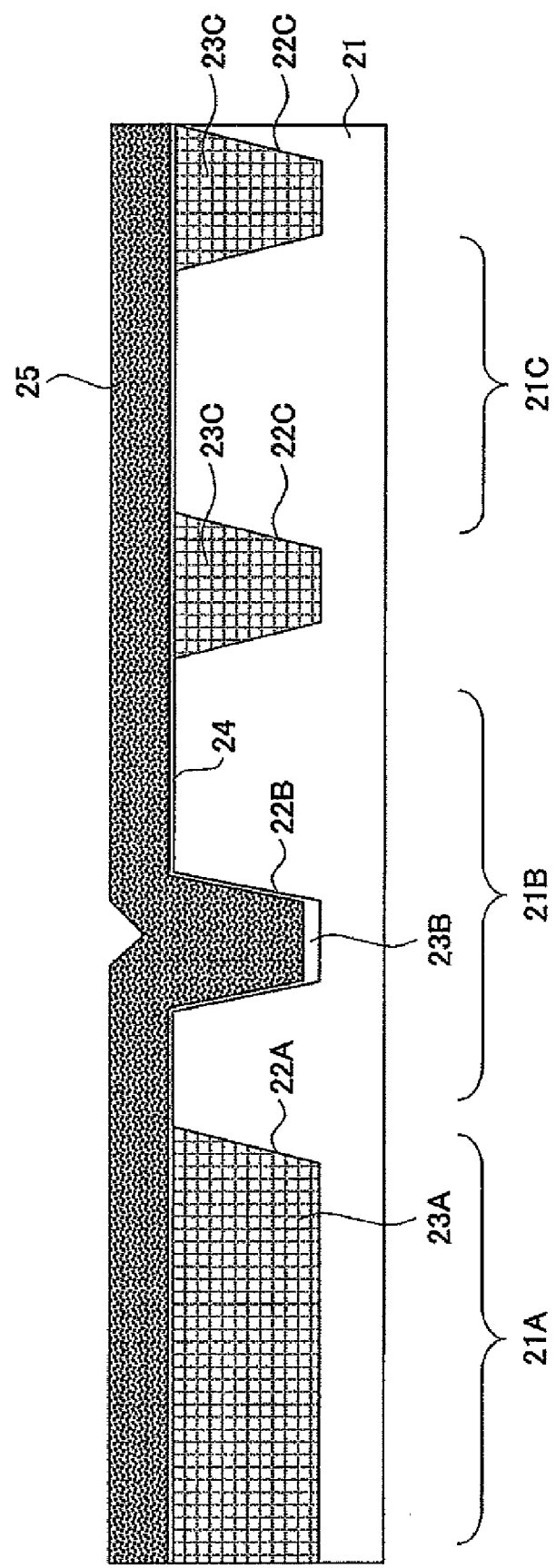

Next, in the step of FIG. 8D, an undoped polysilicon film 25 is deposited on the structure of FIG. 8C at the substrate temperature of 605° C. in order to fill the trench part 22B typically with the thickness of 105 nm. In place of the polysilicon film 25, it is also possible to deposit an amorphous silicon film. In this case, the substrate temperature is set for example to 530° C. in the deposition step. Hereinafter, the film 25 will be designated as "silicon film".

Next, in the step of FIG. 8E, there is formed a resist pattern R1 exposing only the capacitor device region 21B on the structure of FIG. 8D, and ion implantation of B+ is conducted into the silicon film 45 while using the resist pattern R1 as a mask under the acceleration voltage of 4 keV with the dose of $5.5 \times 10^{15}$ cm$^{-2}$, for example. From the view point of the diffusion process to be explained later with reference to FIG. 8G, it is preferable to use B+ having a large diffusion coefficient for the impurity element in this step of FIG. 8E.

Next, in the step of FIG. 8F, the silicon film 25 of the structure of FIG. 5E is patterned, and with this, there are formed resistor patterns 25A in the resistor device region 21A, a top electrode pattern 25B in the capacitor device region 21B, which is reserved for the capacitor to be formed therein, and a gate electrode 25C of the p-channel MOS transistor or n-channel MOS transistor, which is to be formed in the logic device region 21C.

Further, as a result of this patterning process, the thermal oxide film 24 is patterned in conformity with the top electrode pattern 23B, resulting in formation of a capacitor insulation film 24B.

Furthermore, in the logic device region 21C, the thermal oxide film 24 is patterned right underneath the gate electrode 25C, and as a result, there is formed a gate insulation film 24C in conformity with the gate electrode 25C. Similarly, in the resistance region 21A, too, the thermal oxide film 24 is patterned to the shape conformal to the resistor patterns 25A, resulting in formation of insulation film patterns 24A.

From the viewpoint of forming the resistor of high precision while eliminating the effect of stray capacitance caused by the substrate, it is preferable to form the resistor patterns 25A on the insulation film 23A as shown in FIG. 8F.

Next, in the step of FIG. 8G, the structure of FIG. 8F is annealed for the duration of 1 second to 10 seconds at the temperature of 1000° C.-1100° C., and with this, B, which has been introduced in the step of FIG. 8E, undergoes diffusion into the top electrode pattern 25B. As explained already with reference to FIG. 3, the top electrode pattern 25B is given a high electric conductivity for the entire parts thereof even when the initial silicon film is formed of undoped polysilicon or amorphous silicon, and the problem of depletion of the polysilicon top electrode and an associated problem of a decrease of the capacitance of capacitor are resolved.

Further, in the case where the resistor pattern 25A, the top electrode pattern 25B and the gate electrode pattern 25C are formed by an amorphous silicon film in the step of FIG. 8F, crystallization occurs in these silicon layers in the step of FIG. 8G as a result of the thermal annealing process, and this crystallization results in conversion of the amorphous silicon film into a polysilicon film. Furthermore, in the case where the resistor pattern 25A, the top electrode pattern 25B and the gate electrode pattern 25C are formed of a polysilicon film, grain growth occurs in the polysilicon films, and the polysilicon films are converted into a polysilicon film of more coarse grain texture.

In the step of FIG. 8G, no transistor of miniature scale is formed in the logic device region 21C, and thus, there arises no problem of degradation of transistor characteristics formed in the logic device region 21C, even when the thermal annealing process is conducted in the step of FIG. 8G.

Next, in the step of FIG. 8H, a resist pattern R2 is formed on the structure of FIG. 8G in order to expose only the resistor device region 21A, and ion implantation of B+, or an n-type impurity element such as As+ or P+ if necessary, is conducted into the resistor patterns 25A while using the resist pattern R2 as a mask. With this, the resistor patterns 25A are given the desired conductivity and desired resistance value. For example, it is possible to provide the desired conductivity and resistance value to the resistor patterns 25A by introducing B+ as the impurity element by an ion implantation process conducted under the acceleration voltage of 8 keV and the dose of $4.5 \times 10^{15}$ cm$^2$.

Next, in the step of FIG. 8I, the resist pattern R2 is removed, and a resist pattern R3 is formed in order to expose only the logic device region 21C. Further, B+ is introduced into the silicon substrate 21 and the polysilicon gate electrode 25C by an ion implantation process in the case of forming a p-channel MOS transistor in the logic device region 21C. In the case of forming an n-channel MOS transistor in the logic device region 21C, As+ or P+ is introduced into the silicon substrate 21 and also to the polysilicon gate electrode 25C by an ion implantation process. With this, there are formed lightly doped drain (LDD) regions 21a and 21b of p-type for example in the silicon substrate in correspondence to the conductivity type of the introduced impurity element respectively at a first side and a second side opposite to the first side of the gate electrode 25C.

Figure 8J:
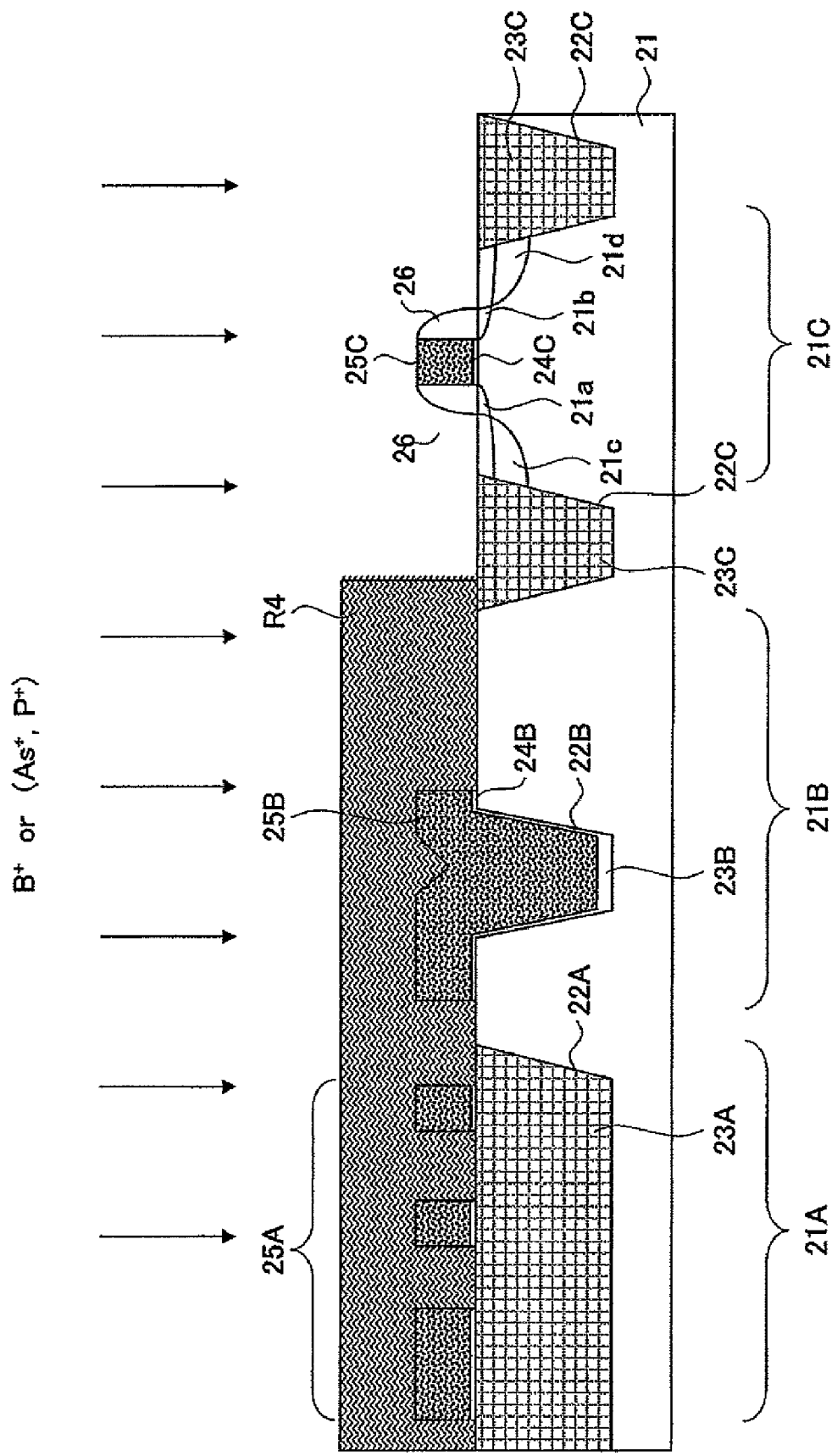

Further, in the step of FIG. 8J, sidewall insulation films 26 are formed at respective sidewall surfaces of the gate electrode 25C, and a resist pattern R4 is formed on the silicon substrate 21 in order to expose only the logic device region 21C. Further, source and drain regions 21c and 21d are formed at respective outer sides of the LDD regions 21a and 21b by introducing B+ into the device region 21C in the case of forming a p-channel MOS transistor in the device region 21C, or by introducing As+ or P+ into the device region 21C in the case of forming an n-channel MOS transistor in the device region 21C, while using the gate electrode 25C and the sidewall insulation films 26 as a self-alignment mask. During this process, the polysilicon gate electrode 25C is doped to a high concentration level of p-type or n-type.

In the step of FIG. 8K, silicide layers 27 of NiSi or CoSi$_2$ are formed on the surface of the polysilicon gate electrode 25C, the surface of the source region 21c and the surface of the drain region 21b, which are exposed in the logic device region 21C, by way of a salicide process, for example. With this, the semiconductor device is completed. While not illustrated, such a silicide layer may also be formed on the top electrode 25B.

Thus, with the present embodiment, the present invention provides a method for fabricating a semiconductor device, including the steps of: forming the first trench part 22B in the capacitor device region 21B of the semiconductor substrate 21, forming the capacitor insulation film 24 on the sidewall surface of the first trench part 22B, forming the semiconductor film 25 to cover the first trench part 22B, the resistor part of the semiconductor substrate 21 and further the logic device region 21C of the semiconductor substrate 21, introducing a first impurity element into the semiconductor film 25 formed in the first trench part, patterning the semiconductor film to form the top electrode pattern 25B in the capacitor device region 21B, the resistor pattern 25A in the resistor device region 21A and the gate electrode pattern 25C in the logic device region 21C, annealing the semiconductor substrate, and introducing a second impurity element into the resistor pattern 25A.

According to the present invention, the silicon top electrode pattern 25B is annealed after the first impurity element is introduced selectively by the ion implantation process. Thereby, it becomes possible that the first impurity element reaches the part of the silicon top electrode pattern 25B covering the innermost bottom of the trench part 22B, and the problem of depletion of the polysilicon top electrode in the capacitor formed in the capacitor device region 21B, as previously explained with reference to FIG. 3, is eliminated. Thus, it becomes possible to effectively compensate for the decrease of capacitance caused with such depletion.

Because the ion implantation process into the resistor device region 21A is conducted after the thermal annealing process for causing the diffusion of the impurity element in the polysilicon top electrode pattern 25B, there is no problem that the impurity element escaping from the resistor pattern 25A, and the problem of variation of the resistance value of the polysilicon resistor pattern 25A, caused as a result of the thermal annealing process as explained with reference to FIG. 5A, can be successfully avoided. Reference should be made to the explanation made previously with reference to FIG. 5B.

Further, with the present embodiment, it should be noted that patterning process for forming the resistor pattern, the top electrode pattern 25B and the gate electrode pattern 25C is conducted prior to the annealing step of FIG. 8G. Thus, the foregoing patterning process can be conducted conveniently without changing the patterning recipe used in usual patterning process of a polysilicon film or an amorphous silicon film.

Preferably, the capacitor insulation film 24 has an increased film thickness in the part 23B covering the bottom surface of the trench part 22B as compared with the film thickness in the part 24B covering the sidewall surface of the trench part 22B. With such a construction, it becomes possible to effectively suppress the leakage current at the bottom of the trench part 22B.

Preferably, the semiconductor substrate 21 is made of a silicon substrate, and the part 24B of the capacitor insulation film 24 covering the sidewall surface of the trench part is made of a thermal oxide film formed by a thermal oxidation process of the silicon substrate 21.

Preferably, B having a large diffusion coefficient is used for the first and second impurity elements. Further, the effect of suppressing the variation of resistance value of the resistor pattern appears conspicuous in the case where the first and second impurity elements are formed of B.

In the resistor device region 21A, another trench part 22A is formed, and the resistors 25A are formed on the insulation film 23A filling this other trench part. Preferably, the trench part 223 and the other trench part 22A are formed on the semiconductor substrate simultaneously. As a result of such a construction, there is no longer the need of forming the trench part 22A, the trench part 22B, the insulation film patterns 23B and 23A with separate processes, and the formation process is simplified.

Preferably, the capacitor insulation film 24 is formed by the steps of: depositing a CVD insulation film on the semiconductor substrate 21 so as to fill the trench part 22B and the other trench part 22A, removing the CVD insulation film on the surface of the semiconductor substrate by a chemical mechanical polishing process, removing the CVD film filling the trench part in the capacitor device region except for the bottom part by an etch-back process, and thermally oxidizing the silicon substrate after the etch-back process. The capacitor insulation film thus formed can be formed to have a greater film thickness in the part covering the bottom of the trench part in the capacitor device region 21B as compared with the part covering the sidewall surface of the trench part. With this, it becomes possible to suppress the occurrence of leakage current at such a bottom part.

The logic device region 21C is defined by a device isolation region, wherein the device isolation region includes the device isolation trench 22C formed in the semiconductor substrate 21 and the device isolation insulation film 23 filling the device isolation trench 22C. The device isolation trench 22C is formed at the same time as the trench part 223 is formed. Furthermore, the other trench part 22A, and the device isolation insulation film 23C are formed at the same time as the insulation film 23A fills the other trench part 22A. With such a process, the steps for separately forming the device isolation trench 22C and the device isolation film 23C are no longer needed, and the fabrication process of the semiconductor device is simplified.

Preferably, the semiconductor substrate 21 is a silicon substrate. It is also preferable that the part of the capacitor insulation film 24 covering the sidewall surface of the trench part 22B and the gate insulation film 24C are formed simultaneously by the thermal oxidation process applied to the surface of the silicon substrate 21. With such a process, there is no longer the need of separately forming the gate insulation film 24C and the capacitor insulation film 24, and the fabrication process of the semiconductor device is simplified.

Preferably, the gate electrode pattern 25C is formed at the same time that the silicon top electrode pattern 25B and the silicon resistor pattern 25A are formed as a result of patterning of the silicon film 25. With such a construction, there is no longer the need for forming the gate electrode 25C with a process separate from the forming of the silicon top electrode pattern 25B or forming of the silicon resistor pattern 25A, and the fabrication process of the semiconductor device is simplified.

Further, by conducting an ion implantation process of a third impurity element in the logic device region 21C while using the gate electrode pattern 25C as a mask, the diffusion regions 21a and 21b, and further the diffusion regions 21C and 21d, are formed respectively at a first side and a second side opposite to the first side of the gate electrode pattern 25C. Thus, it becomes possible to form a p-channel MOS transistor or an n-channel MOS transistor, or a complementary metal-oxide semiconductor (CMOS) device including a p-channel MOS transistor and an n-channel MOS transistor, in the logic device region 21C.

It is preferable that the trench part 22B has a width of 0.25 μm or less at the surface of the semiconductor substrate 21 and a depth exceeding 0.2 μm. The effect of the present invention appears particularly conspicuous in the case of forming a capacitor element in such a miniaturized trench part having a large aspect ratio.

In the present embodiment, it is also possible to convert the thermal oxide film 24 into an oxynitride film by carrying out a plasma nitridation processing immediately after the step of FIG. 8C. As a result of such a construction and process, it becomes possible to further increase the capacitance of the capacitor, and the oxide film equivalent thickness of the gate insulation film can be reduced for the p-channel MOS transistor or the n-channel MOS transistor formed in the logic device region 21C. Because of this, it becomes possible to operate these transistors with higher speed by using a shorter gate length. Further, in the step of FIG. 8C, it is also possible to form a plasma oxide film or plasma oxynitride film directly on the surface of the silicon substrate 21 in place of the thermal oxide film 24.

FIGS. 9A-9K are diagrams showing the process of fabricating a semiconductor device according to a second embodiment of the present invention.

Referring to FIG. 9A, there are defined a resistor device region 41A, a capacitor device region 41B and a logic device region 41C on a silicon substrate 41, and trenches 42A, 42B and 42C are formed simultaneously in the resistor device region 41A, the capacitor device region 41B and the logic device region 41C, respectively.

In one example, the trench 42B and the device isolation trench 42C are formed, in accordance with the design rule, such that the trench part 42B and the device isolation trench 42C have a width of 0.1 μm at the surface of the silicon substrate 41 and a depth of 0.2 μm.

The trench parts 42A and 42B and the device isolation trench 42C are filled respectively with CVD oxide films 43A, 43B and 43C, wherein excessive silicon oxide film at the surface of the silicon substrate 41 is removed by a chemical mechanical polishing (CMP) process.

Next, in the step of FIG. 9B, the resistor device region 41A and the logic device region 41C are covered with a resist pattern (not shown), and an etch-back process is conducted for the exposed capacitor device region 41B in order to etch back the silicon oxide film therein by a dry etching process. With this, the CVD oxide film 43B is receded at the trench part 42B until a CVD oxide film 43B is left at the bottom of the trench part 42B with a thickness of 70 nm, for example. Further, in this step, ion implantation of a p-type element such as B+, or if necessary an n-type element such as As+ or P+, is conducted for the capacitor device region 41B, and with this, a conductive well 41W is formed as the bottom electrode of the capacitor. In the explanation below, further description of the conductive well 21W is omitted.

Figure 9C:
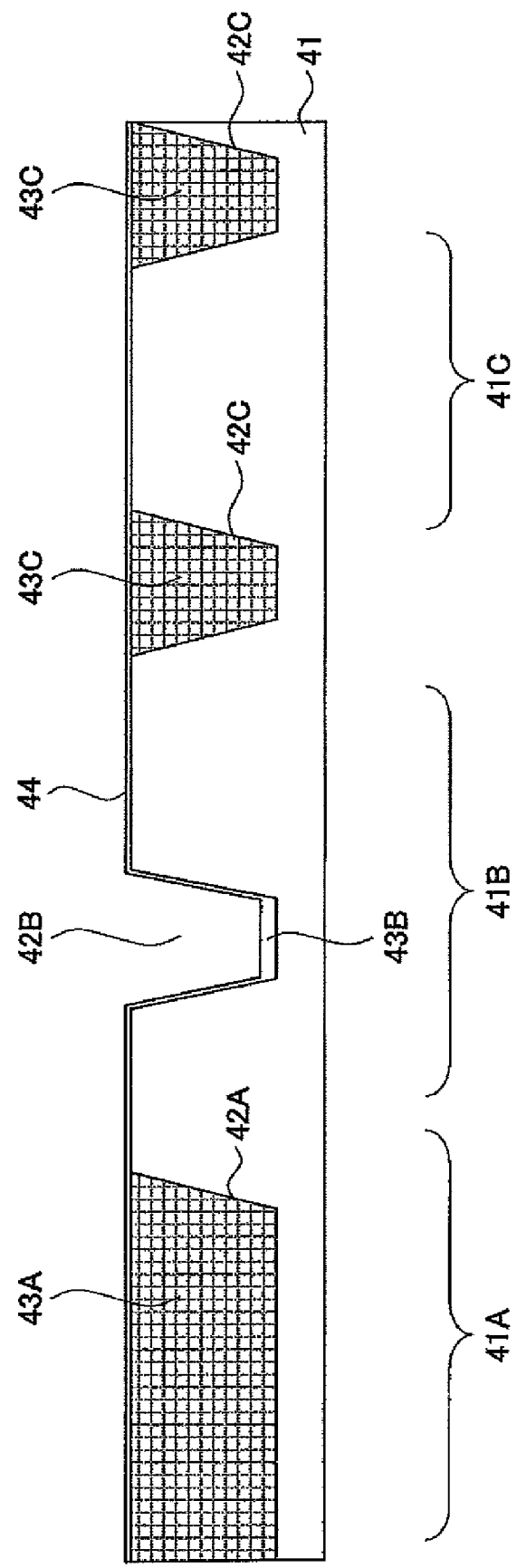

Next, in the step of FIG. 9C, a thermal oxidation process is performed on the structure of FIG. 9B in an oxygen ambient at the temperature of 1000° C., for example, and with this, a thermal oxide film 44 is formed on the surface of the silicon substrate 41, including the exposed sidewall surface of the trench part 42B with a thickness of 2 nm, for example.

Figure 9D:
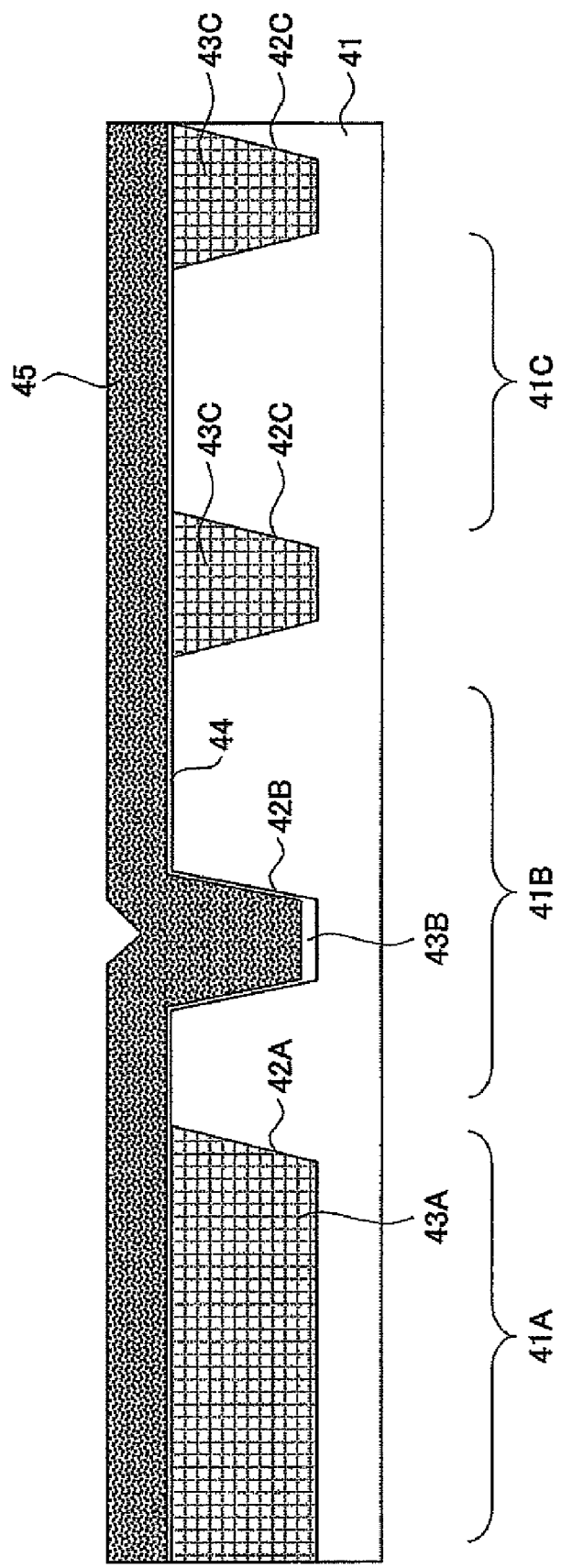

Next, in the step of FIG. 9D, an undoped polysilicon film 45 is deposited on the structure of FIG. 9C at the substrate temperature of 605° C. in order to fill the trench part 42B typically with the thickness of 105 nm. In place of the polysilicon film 45, it is also possible to deposit an amorphous silicon film. In this case, the substrate temperature is set to 530° C., for example, in the deposition step. Hereinafter, the film 45 will be designated as "silicon film".

Next, in the step of FIG. 9E, a resist pattern R11 is formed exposing only the capacitor device region 41B on the structure of FIG. 9D, and an ion implantation of B+ is performed on the silicon film 45 while using the resist pattern R11 as a mask under the acceleration voltage of 4 keV with the dose of $5.5 \times 10^{15}$ cm$^{-2}$, for example. For the purposes of the diffusion process, which is explained later with reference to FIG. 9F, it is preferable to use B+ having a large diffusion coefficient in this step of FIG. 9E for the impurity element.

Figure 9F:
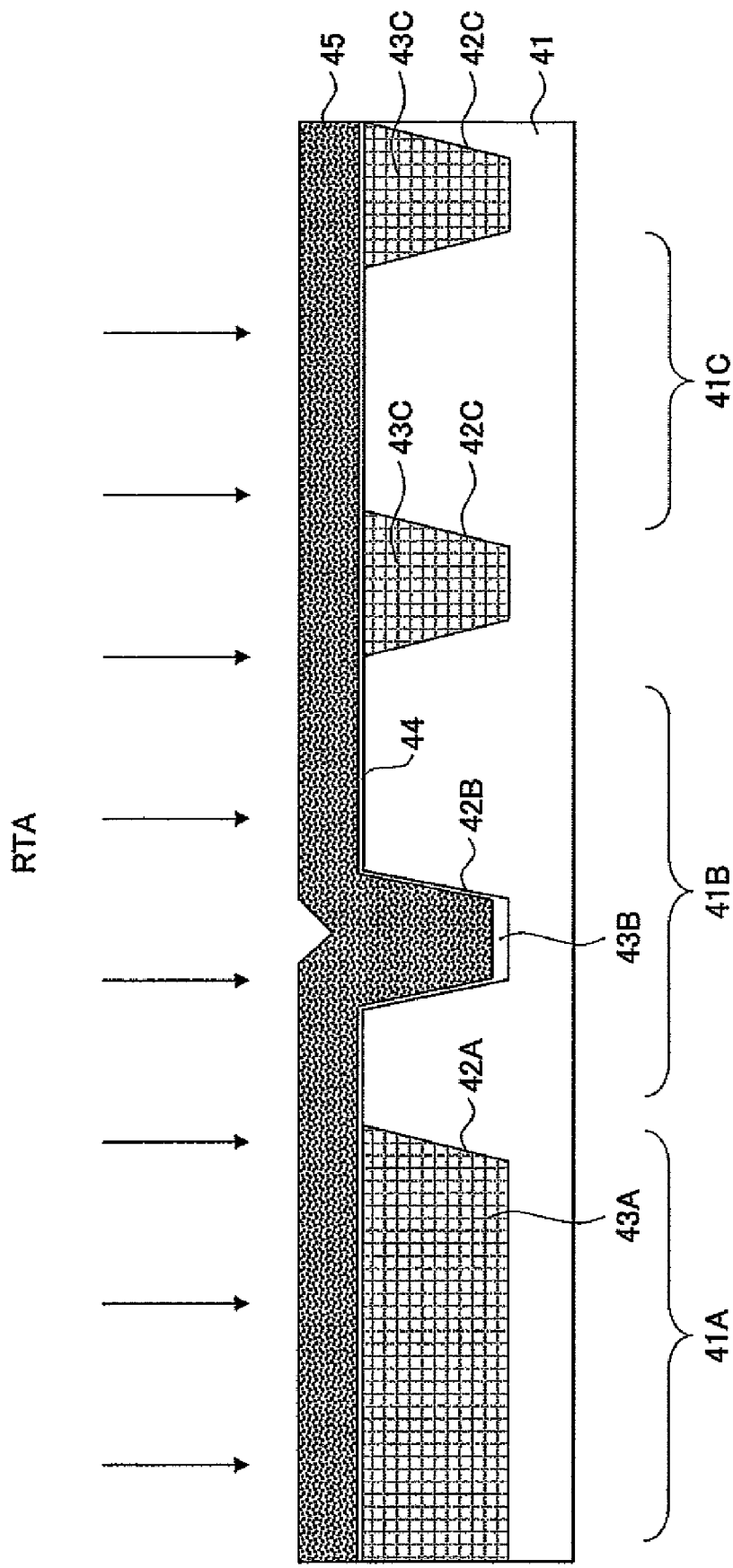

Next, in the step of FIG. 9F, the structure of FIG. 9E is annealed for the duration of several seconds to about 10 seconds at the temperature of 1000-1100° C., and with this, B undergoes diffusion into the top electrode pattern 45B. As explained already with reference to FIG. 3, the entire silicon film 45 is given a high electric conductivity, even when the initial silicon film is formed of undoped polysilicon or amorphous silicon, and the problem of depletion of the polysilicon top electrode and the associated problem of a decrease of capacitance of the capacitor are reduced or eliminated. Further, in the step of FIG. 9F, crystallization occurs in the silicon film 45, in the case where the silicon film 45 is formed as an amorphous silicon film in the step of FIG. 9E, which results in a conversion of the amorphous silicon film into polysilicon film. Furthermore, in the case where the silicon film 45 is formed of a polysilicon film, grain growth occurs in the polysilicon film 45, which results in conversion of the polysilicon film 45 into a polysilicon film of more coarse texture.

In the step of FIG. 9F, no transistor of miniature scale is formed in the logic device region 41C, and thus, there arises no problem of degradation of transistor characteristics formed in the logic device region 41C, even when the thermal annealing process is conducted in the step of FIG. 9F.

Figure 9G:
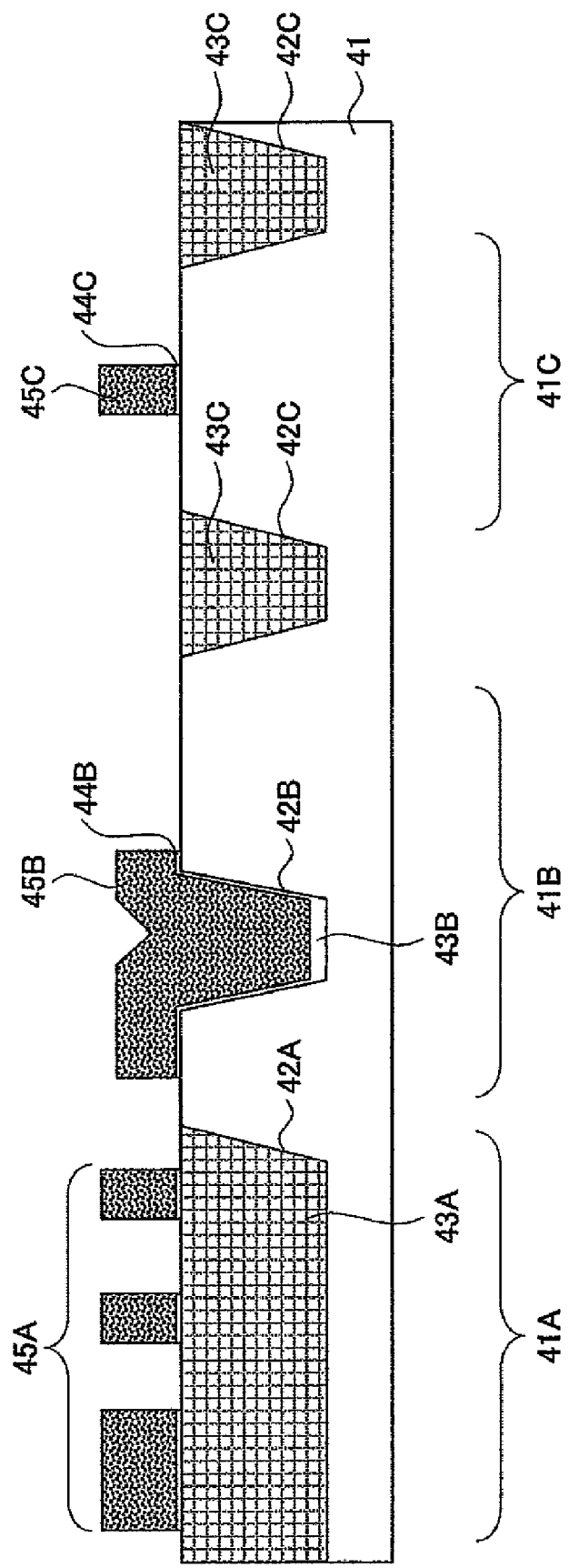

Next, in the step of FIG. 9G, the silicon film 45 of polysilicon or amorphous silicon of the structure of FIG. 9E is patterned, and with this, resistor patterns 45A are formed in the resistor device region 41A, a top electrode pattern 45B in the capacitor device region 41B, which is reserved for the capacitor to be formed therein. Furthermore, a gate electrode 45C of the p-channel MOS transistor or an n-channel MOS transistor is formed in the logic device region 41C. As a result of this patterning process, the thermal oxide film 44 is patterned in conformity with the top electrode pattern 45B, resulting in formation of a capacitor insulation film 44B. In the logic device region 21C, the thermal oxide film 44 is patterned right underneath the gate electrode 45C, and as a result, a gate insulation film 44C is formed in conformity with the gate electrode 45C. In the resistance region 41A, the thermal oxide film 44 is patterned to the shape that conforms with the resistor patterns 45A, resulting in formation of insulation film patterns 44A.

Next, in the step of FIG. 9H, a resist pattern R12 is formed on the structure of FIG. 9G in order to expose only the resistor device region 41A. Ion implantation of B+, or an n-type impurity element such as As+ or P+ if necessary, is performed on the resistor patterns 45A while using the resist pattern R12 as a mask. With this, the resistor patterns 45A are given the desired conductivity and desired resistance value. For example, it is possible to provide the desired conductivity and resistance value to the resistor patterns 25A by introducing B+ as the impurity element by an ion implantation process conducted under the acceleration voltage of 8 keV and the dose of $4.5 \times 10^{15}$ cm$^{-2}$.

Next, in the step of FIG. 9I, the resist pattern R12 is removed, and a resist pattern R13 is formed in order to expose only the logic device region 21C. Further, B+ is introduced into the silicon substrate 41 and the polysilicon gate electrode 45C by an ion implantation process in the case where a p-channel MOS transistor is formed in the logic device region 41C. In the case of forming an n-channel MOS transistor in the logic device region 41C, As+ or P+ is introduced into the silicon substrate 41 and into the polysilicon gate electrode 45C by an ion implantation process. With this, LDD regions 41a and 41b of p-type are formed, for example, in the silicon substrate corresponding to the conductivity type of the introduced impurity element at a first side and a second side opposite to the first side of the gate electrode 45C.

Further, in the step of FIG. 9J, sidewall insulation films 46 are formed at respective sidewall surfaces of the gate electrode 45C, and a resist pattern R14 is formed on the silicon substrate 41 to expose only the logic device region 41C. In addition, source and drain regions 41c and 41d are formed at respective outer sides of the LDD regions 41a and 41b by introducing B+ into the device region 41C in the case of forming a p-channel MOS transistor in the device region 41C, or by introducing As+ or P+ into the device region 41C in the case of forming an n-channel MOS transistor in the device region 41C, while using the gate electrode 45C and the sidewall insulation films 46 as a self-alignment mask. During this process, the polysilicon gate electrode 45C is doped to a high concentration level of p-type or n-type.

Figure 9K:
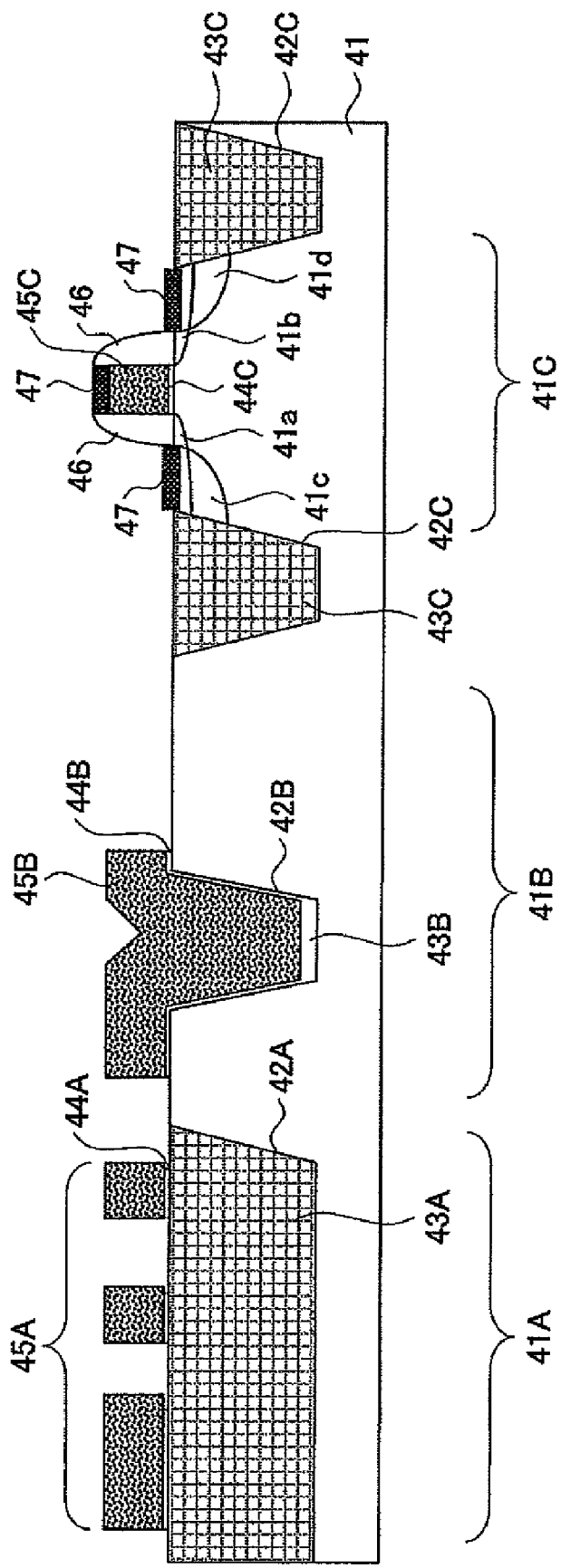

Further, in the step of FIG. 9K, silicide layers 47 of NiSi or $CoSi_2$ are formed on the surface of the polysilicon gate electrode 45C, the surface of the source region 41c and the surface of the drain region 41b, which surfaces are exposed in the logic device region 41C, by way of a salicide process, for example. With this, the semiconductor device is completed. While not illustrated, such a silicide layer may also be formed also on the top electrode 45B.

Thus, the present embodiment of the invention provides a fabrication process of a semiconductor device, comprising the steps of: forming the first trench part 42B in the capacitor device region 41B on the semiconductor substrate 41, forming the capacitor insulation film 44 on the sidewall surface of the first trench part 42B, depositing the semiconductor film 45 to cover the first trench part 42B, the resistor device region of the semiconductor substrate and the logic device region 41C of the semiconductor substrate, introducing the first impurity element into the semiconductor film 45 in the capacitor device region 41B, annealing the semiconductor substrate 41, patterning the semiconductor film 45 to form the top electrode pattern 45B in the capacitor device region 41B, the resistor patterns 45A in the resistor device region 41A, and the gate electrode pattern 45C in the logic device region 41C, and introducing the second impurity element into the resistor patterns 45A.

According to the present invention, the silicon top electrode pattern 45B is annealed after the first impurity element is selectively introduced by the ion implantation process. Because of this, it becomes possible that the first impurity element reaches the part of the silicon top electrode pattern 45B covering the innermost bottom of the trench part 42B, and the problem of depletion of the polysilicon top electrode in the capacitor formed in the capacitor device region 41B (as explained with reference to FIG. 3) is eliminated. Thus, it becomes possible to effectively compensate for the decrease of capacitance caused with such depletion. As a result, it should be noted that, because the ion implantation process into the resistor device region 41A is conducted after the thermal annealing process for causing the diffusion of the impurity element in the polysilicon top electrode pattern 45B, the impurity element does not escape from the resistor patterns 45A. Therefore, the problem of variation of the resistance value of the polysilicon patterns 45A of the resistor caused by the thermal annealing process (as explained with reference to FIG. 5A) can be successfully avoided.

Preferably, the capacitor insulation film 44 has an increased film thickness in the part 43B covering the bottom surface of the trench part 42B as compared with the film thickness in the part 44B covering the sidewall surface of the trench part 42B. With such a construction, it becomes possible to effectively suppress the leakage current at the bottom of the trench part 42B.

Preferably, the semiconductor substrate 41 is made of a silicon substrate, and the part 44B of the capacitor insulation film 44 covering the sidewall surface of the trench part is made of a thermal oxide film formed by a thermal oxidation process of the silicon substrate 41.

Preferably, B having a large diffusion coefficient is used for the first and second impurity elements. Further, the effect of suppressing the variation of resistance value of the resistor pattern appears conspicuous in the case the first and second impurity elements are formed of B.

In the resistor device region 41A, there is formed another trench part 42A, and the resistors 45A are formed on the insulation film 43A filling this other trench part. Preferably, the trench part 42B and the other trench part 42A are formed on the semiconductor substrate simultaneously. As a result of such a construction, there is no longer the need of forming the trench part 42A, the trench part 42B, the insulation film patterns 43B and 43A with separate processes, and the formation process is simplified.

Preferably, the capacitor insulation film 44 is formed by the steps of: depositing a CVD insulation film on the semiconductor substrate 41 to fill the trench part 42B and the other trench part 42A, removing the CVD insulation film on the surface of the semiconductor substrate by a chemical mechanical polishing process, removing the CVD film filling the trench part in the capacitor device region except for the bottom part by an etch-back process, and thermally oxidizing the silicon substrate after the etch-back process. The capacitor insulation film can be formed to have a greater film thickness in the part covering the bottom of the trench part in the capacitor device region 41B as compared with the film thickness in the part covering the sidewall surface of the trench part. With this, it becomes possible to suppress any leakage current at such a bottom part.

The logic device region 41C is defined by a device isolation region, wherein the device isolation region includes the device isolation trench 42C formed in the semiconductor substrate 41 and the device isolation insulation film 43 filling the device isolation trench. There, the device isolation trench 42C is formed at the same time as the formation of the trench part 42B and the other trench part 42A, and the device isolation insulation film 43C is formed at the same time as the formation of the insulation film 43A filling the other trench part 42A. With such processes, the steps for separately forming the device isolation trench 42C and the device isolation film 43C are no longer needed, and the fabrication process of the semiconductor device is simplified.

Preferably, the semiconductor substrate 41 is a silicon substrate. Further, it is preferable that the part of the capacitor insulation film 44 covering the sidewall surface of the trench part 42B and the gate insulation film 44C are formed simultaneously by the thermal oxidation process applied to the surface of the silicon substrate 41. With such a process, there is no longer the need of separately forming the gate insulation film 44C and the capacitor insulation film 44, and the fabrication process of the semiconductor device is simplified.

Preferably, the gate electrode pattern 45C is formed at the same time as the silicon top electrode pattern 45B and the silicon resistor pattern 45A as a result of patterning of the silicon film 45. With such a construction, there is no longer the need for forming the gate electrode 45C with a process separate from forming of the silicon top electrode pattern 25B or of the silicon resistor pattern 45A, and the fabrication process of the semiconductor device is simplified.

Further, by conducting an ion implantation process of a third impurity element in the logic device region 41C while using the gate electrode pattern 45C as a mask, the diffusion regions 41a and 41b, and the diffusion regions 41c and 41d, are formed at a first side and a second side opposite to the first side of the gate electrode pattern 45C. Thus, it becomes possible to form a p-channel MOS transistor or an n-channel MOS transistor, or a CMOS device that includes a p-channel MOS transistor and an n-channel MOS transistor, in the logic device region 41C.

It is preferable that the trench part 42B has a width of 0.25 µm or less at the surface of the semiconductor substrate 41 and a depth exceeding 0.2 µm. The present invention appears particularly effective in the case of forming a capacitor in such a miniaturized trench part having a large aspect ratio.

In the present embodiment, it is also possible to convert the thermal oxide film 44 into an oxynitride film by carrying out a plasma nitridation processing immediately after the step of FIG. 9C. As a result of such a construction and process, it becomes possible to further increase the capacitance of the capacitor, and the oxide film equivalent thickness of the gate insulation film can be reduced for the p-channel MOS transistor or the n-channel MOS transistor formed in the logic device region 41C. Therefore, it becomes possible to operate these transistors at a higher speed by using a shorter gate length. Furthermore, in the step of FIG. 9C, it is also possible to form a plasma oxide film or plasma oxynitride film directly on the surface of the silicon substrate 41 in place of the thermal oxide film 44.

While the present invention has been explained for preferred embodiments, the present invention is not limited to such specific embodiments and various variations and modifications may be made within the scope of the invention described in patent claims.

What is claimed is:

1. A method of manufacturing a semiconductor device, comprising:

forming a first trench in a capacitor device region of a semiconductor substrate;

forming a capacitor insulation film over a sidewall surface of said first trench;

forming a semiconductor film to cover said first trench, a resistor device region of said semiconductor substrate and a logic device region of said semiconductor substrate;

introducing a first impurity element into said semiconductor film formed over said first trench;

patterning said semiconductor film to form a top electrode in said capacitor device region, a resistor in said resistor device region and a gate electrode in said logic device region;

annealing said semiconductor substrate; and introducing a second impurity element in said resistor.

2. The method as claimed in claim 1, wherein said semiconductor film comprises an undoped silicon film.

3. The method as claimed in claim 1, wherein said capacitor insulation film is formed also over a bottom surface of said first trench, and wherein said capacitor insulation film over the bottom surface has a first film thickness, and said capacitor insulation film over the sidewall surface has a second film thickness thinner than the first film thickness.

4. The method as claimed in claim 1, wherein said semiconductor device comprises a silicon substrate and said capacitor insulation film formed over said sidewall surface is a thermal oxide film.

5. The method as claimed in claim 1, wherein said first impurity element and said second impurity element are boron.

6. The method as claimed in claim 1, wherein a second trench is formed in said resistor device region in forming said first trench.

7. The method as claimed in claim 6, wherein said capacitor insulation film is formed by:

depositing an insulation film in said first trench and in said second trench; removing said insulation film in said first trench in said capacitor device region; and thermally oxidizing said silicon substrate.

8. The method as claimed in claim 1, wherein said resistor is formed over said insulation film in said second trench.

9. The method as claimed in claim 7, wherein said logic device region is defined by a device isolation region, said device isolation region comprising a device isolation trench formed in said semiconductor substrate and a device isolation insulation film in said device isolation trench; said device isolation trench being formed in the steps of forming said first trench and forming said second trench, said device isolation insulation film being deposited in said step of depositing said insulation film.

10. The method as claimed in claim 1, wherein said semiconductor substrate comprises a silicon substrate, and wherein said capacitor insulation film covering said sidewall surface of said first trench and said gate insulation film are formed simultaneously by thermal oxidation of a surface of said silicon substrate.

11. The method as claimed in claim 1, wherein said gate electrode is formed by patterning of said semiconductor film in said step of patterning said top electrode and said resistor.

12. The method as claimed in claim 1, further comprising:

introducing a third impurity element into said semiconductor substrate in said logic device region while using said gate electrode as a mask.

13. The method as claimed in claim 1, wherein said first trench has a width of 0.08 μm-0.25 μm at a surface of said semiconductor substrate.

14. The method as claimed in claim 1, wherein said first trench has a depth of 0.2 μm-0.35 μm.

15. A method of manufacturing a semiconductor device, comprising:

forming a first trench in a capacitor device region of a semiconductor substrate;

forming a capacitor insulation film over a sidewall surface of said first trench;

depositing a semiconductor film over said first trench, a resistor device region of said semiconductor substrate and a logic device region of said semiconductor substrate;

introducing a first impurity element into said semiconductor film;

annealing said semiconductor substrate;

patterning said semiconductor film to form a top electrode in said capacitor device region, a resistor in said resistor device region and a gate electrode in said logic device region; and introducing a second impurity element in said resistor.

* * * * *